(12) United States Patent
Aya et al.

(10) Patent No.: US 6,281,057 B2
(45) Date of Patent: *Aug. 28, 2001

(54) METHOD OF MANUFACTURING A SEMICONDUCTOR DEVICE

(75) Inventors: Yoichiro Aya; Tomoyuki Nouda; Yasuo Nakahara; Naoya Sotani; Hisashi Abe, all of Gifu; Hiroki Hamada, Osaka, all of (JP)

(73) Assignee: Sanyo Electric Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/004,779

(22) Filed: Jan. 9, 1998

(30) Foreign Application Priority Data

| Jan. 9, 1997 | (JP) | 9-002450 |
| Mar. 25, 1997 | (JP) | 9-072279 |
| Mar. 31, 1997 | (JP) | 9-080221 |
| Jun. 20, 1997 | (JP) | 9-164644 |
| Dec. 15, 1997 | (JP) | 9-345084 |

(51) Int. Cl.$^7$ ................................. H01L 21/84
(52) U.S. Cl. .......................................... 438/166
(58) Field of Search ................... 148/187, 174; 136/258; 438/97, 166, 795, 308, 487

(56) References Cited

U.S. PATENT DOCUMENTS

| 5,612,251 | * | 3/1997 | Lee ........................... 437/173 |
| 5,654,203 | * | 8/1997 | Ohtani et al. ................ 438/97 |
| 5,771,110 | * | 6/1998 | Hirano et al. ............... 257/72 |
| 5,811,327 | * | 9/1998 | Funai et al. ................. 438/166 |
| 5,869,362 | * | 2/1999 | Ohtani ........................ 438/166 |
| 5,942,050 | * | 8/1999 | Green et al. ................ 136/258 |
| 5,946,561 | * | 8/1999 | Yamazaki et al. .......... 438/166 |

* cited by examiner

Primary Examiner—Matthew Smith
Assistant Examiner—Calvin Lee
(74) Attorney, Agent, or Firm—Armstrong, Westerman, Hattori, McLeland & Naughton, LLP

(57) ABSTRACT

A method is obtained of manufacturing a semiconductor device including a semiconductor layer with high field-effect mobility. According to the semiconductor device manufacturing method, a semiconductor layer is formed on a substrate and then the semiconductor layer is irradiated with high energy beam. Then, a heat treatment is provided under a temperature condition capable of reducing the surface roughness of the semiconductor layer. The radiation of high energy beam toward the semiconductor layer improves the crystalinity of the semiconductor layer and the subsequent heat treatment reduces the surface roughness of the semiconductor layer to enhance the field-effect mobility of the semiconductor layer.

21 Claims, 32 Drawing Sheets

LASER RADIATION

METHOD OF MANUFACTURING A SEMICONDUCTOR DEVICE

BACKGROUND OF THE INVENTION

1. Field of the Invention

The present invention relates to a method of manufacturing a semiconductor device, and in particular to a method of manufacturing a semiconductor device having a semiconductor layer.

2. Description of the Background Art

Conventionally, liquid crystal displays (LCDs) include a display pixel portion arranged in a matrix and a drive circuit portion which drives the display pixel portion. Generally, for LCDs, a transistor which configures the drive circuit portion is required to have higher mobility (rapidity) than a transistor which configures the display pixel portion. In recent years, high mobility has been achieved to some extent by employing polycrystalline silicon film as an active layer of a thin film transistor (TFT) which configures the drive circuit. Thus, the TFT formed of polycrystalline silicon film has been employed as not only a transistor configuring the display pixel portion but also a transistor configuring the drive circuit portion. As polycrystalline silicon film has been used as the active layers of a TFT configuring the display pixel portion and the TFT configuring the drive circuit portion, a so-called LCD integral with a drive circuit has been developed in which the display pixel portion and the drive circuit portion are formed on the same substrate.

For LCDs including such a TFT that employs polycrystalline silicon film as an active layer, a further rapid TFT configuring the drive circuit portion is required with higher definition and higher density of the pixels of the LCDS. Accordingly, researches have been conventionally conducted to improve the mobility of the TFT active layer formed of polycrystalline silicon film. Various methods have been proposed to achieve high mobility, for example, by changing a material gas used in forming a silicon layer serving as a polycrystalline silicon film from silane ($SiH_4$) gas to disilane ($Si_2H_6$) gas to relatively increase the grain size of the polycrystalline silicon film after its solid phase crystallization (SPC).

However, it is difficult to obtain a TFT active layer of sufficient high mobility even with such a technique proposed as above. Thus, it is particularly difficult to achieve a faster drive circuit when such a TFT is used in an LCD and hence to improve the display characteristics of the LCD.

SUMMARY OF THE INVENTION

One object of the present invention is to readily manufacture a semiconductor device with a semiconductor layer of high mobility in a method of manufacturing the semiconductor device.

Another object of the present invention is to reduce crystal defect of a semiconductor layer and the roughness of a surface of the semiconductor layer in a method of manufacturing a semiconductor device.

A method of manufacturing a semiconductor device in one aspect of the present invention includes the steps of: initially forming a semiconductor layer on a substrate; irradiating the semiconductor layer with high energy beam; and then performing a heat treatment under a temperature condition capable of reducing the roughness of a surface of the semiconductor layer. According to the present invention, since a semiconductor layer is irradiated with high energy beam, crystal defect of the semiconductor layer can be reduced and the crystallinity of the semiconductor layer can thus be improved. Furthermore, the heat treatment under a temperature condition capable of reducing the surface roughness of the semiconductor layer after the radiation of high energy beam can effectively reduce the roughness of the surface of the semiconductor layer increased due to the radiation of high energy beam. Thus, the manufacturing method in one aspect of the present invention can reduce crystal defect of a semiconductor layer and the roughness of a surface of the semiconductor layer. Thereby, the field-effect mobility of the semiconductor layer can be improved and the drain current of the semiconductor layer can thus be increased. With such a semiconductor layer used in a liquid crystal display, the drive circuit portion can rapidly operate and the high definition and high density of the pixel portion can be achieved. It is preferable that the heat treatment be performed at a temperature of 900° C. to 1100° C., preferably in rapid thermal annealing. The use of rapid thermal annealing allows a high temperature treatment to be finished in an extremely short period of time, and thus disadvantages, such as deformation of the substrate, can be avoided while crystal defect of the semiconductor layer or the like is reduced by the high-temperature heat treatment.

In the method of manufacturing a semiconductor device in the above one aspect of the present invention, solid phase crystallization may be employed to render an amorphous semiconductor layer polycrystalline so that a polycrystalline silicon layer is formed, and the polycrystalline semiconductor layer may be irradiated with high energy beam. The radiation of high energy beam is preferably provided while the polycrystalline semiconductor layer is heated, preferably in 100° C. to 600° C. Since the polycrystalline semiconductor layer is heated at the same time as the radiation of high energy beam, the roughness of a surface of the polycrystalline semiconductor layer can be reduced and the mobility of a transistor can thus be improved. Furthermore, the cost for maintenance of the laser device can be reduced since laser energy density can be reduced as compared with the case where heating is not provided during laser radiation. Prior to the radiation of high energy beam, a surface of the polycrystalline semiconductor layer may be oxidized to form oxide film which is then removed to expose a surface of the polycrystalline semiconductor layer and the exposed polycrystalline semiconductor layer may be irradiated with high energy beam to further improve the crystallinity of the polycrystalline semiconductor layer.

In the method of manufacturing a semiconductor device in the above one aspect of the present invention, a substrate may be provided thereon with an amorphous semiconductor layer which is then irradiated with high energy beam to render the amorphous semiconductor layer polycrystalline so that a polycrystalline semiconductor layer is formed. The heat treatment may be performed immediately after the radiation of high energy beam, or after an insulating film and a polycrystalline silicon film are successively formed on the polycrystalline semiconductor layer after the radiation of high energy beam. The heat treatment is preferably performed through rapid thermal annealing. The use of rapid thermal annealing allows a high-temperature treatment to be finished in an extremely short period of time, and thus disadvantages, such as deformation of the substrate, are avoided while crystal defect of the semiconductor layer or the like is reduced by a high-temperature heat treatment.

In the method of manufacturing a semiconductor device in the above one aspect of the present invention, high energy beam preferably includes either laser or xenon arc lamp. When laser or xenon arc lamp is used, the crystals of the semiconductor layer can effectively absorb the radiated energy and thereby the crystallinity of the semiconductor layer as an active layer can readily be improved. Furthermore, the semiconductor layer may include a silicon layer. Preferably, the semiconductor layer includes an active layer of a thin film transistor. Furthermore, a gate electrode may be formed on the semiconductor layer after the formation of the semiconductor layer with a gate insulating layer interposed therebetween, or the semiconductor layer may be formed on a gate electrode formed on the substrate with a gate insulating layer interposed therebetween.

A method of manufacturing a semiconductor device in another aspect of the present invention includes the steps of: initially forming an amorphous semiconductor layer on an insulating substrate; rendering the amorphous semiconductor layer polycrystalline by solid phase crystallization to form a polycrystalline semiconductor layer; irradiating the polycrystalline semiconductor layer with high energy beam; and then performing a heat treatment under a temperature condition capable of reducing the roughness of a surface of the polycrystalline semiconductor layer. Since the polycrystalline semiconductor layer is irradiated with high energy beam and a heat treatment is then performed under a temperature condition capable of reducing the roughness of a surface of the polycrystalline semiconductor layer, crystal defect of the polycrystalline semiconductor layer can be reduced and the roughness of the surface of the polycrystalline semiconductor layer can be reduced. Accordingly, when the polycrystalline semiconductor layer is used as an active layer of a transistor, the field-effect mobility of the transistor can be improved and the drain current of the transistor can thus be increased. When such a transistor is used in an LCD, the drive circuit portion can rapidly operate and the high definition and high density of the pixel portion can be achieved. In the method of manufacturing a semiconductor device in the above another aspect of the present invention, it is preferable that the radiation of high energy beam be provided while the polycrystalline semiconductor layer is heated. This allows further reduction in the roughness of a surface of the polycrystalline semiconductor layer and hence further improvement in the field-effect mobility of the transistor.

A method of manufacturing a semiconductor device in still another aspect of the present invention includes the steps of: initially forming an amorphous semiconductor layer on an insulating substrate; irradiating the amorphous semiconductor layer with high energy beam to achieve polycrystallization of the amorphous semiconductor layer so that a polycrystalline semiconductor layer is formed; and then performing a heat treatment under a temperature condition capable of reducing the roughness of a surface of polycrystalline semiconductor layer. These steps can improve the crystallinity of the polycrystalline semiconductor layer as well as reduce the roughness of a surface of the polycrystalline semiconductor layer. Accordingly, when the polycrystalline semiconductor layer is used as an active layer of a transistor, the field-effect mobility of the transistor can be improved and the drain current of the transistor can thus be increased. When such a transistor is used in an LCD, the drive circuit portion can rapidly operate and the high definition and high density of the pixel portion can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will now be described with reference to the drawings.
First Embodiment
Referring to FIGS. 1–12, a process will now be described for manufacturing a semiconductor device (TFT) according to a first embodiment of the present invention.

Figure 1:
FIGS. 1–12 are cross-sections illustrating a process for manufacturing a semiconductor device (TFT) according to a first embodiment of the present invention.

Referring to FIG. 1, in a first step, an amorphous silicon film (an amorphous semiconductor film) 2 is formed on a transparent insulating substrate 1 of glass or quartz glass by low pressure chemical vapor deposition (LPCVD) with disilane ($Si_2H_6$) gas used as a material gas. Amorphous silicon film 2 is formed to have a film thickness of approximately 100 nm in a temperature of approximately 450° C.

Figure 2:
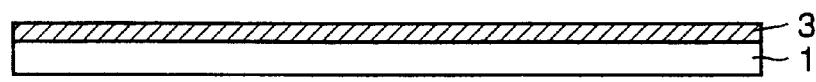

FIG. 2 shows a second step in which solid phase crystallization (SPC) is employed to provide annealing for approximately 20 hours at a temperature of approximately 600° C. Thus, amorphous silicon film 2 is rendered polycrystalline and refined to a polycrystalline silicon film 3. Meanwhile, the film thickness of polycrystalline silicon film 3 is reduced to approximately 90 nm.

Figure 3:

FIG. 3 shows a third step in which dry oxidation for approximately 30 minutes is provided in an $O_2$ ambient of approximately 1050° C. to oxidize a surface of polycrystalline silicon film 3. Thus, a silicon dioxide ($SiO_2$) film 4 with a film thickness of approximately 20 nm is formed on the surface of polycrystalline silicon film 3.

Figure 4:
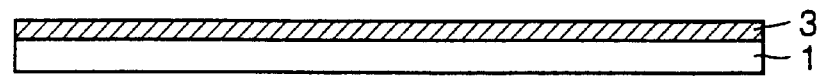

Then, a hydrofluoric acid based etchant is used to remove $SiO_2$ film 4 by wet etching in a fourth step. A surface of polycrystalline silicon film 3 is thus exposed, as shown in FIG. 4. Since a surface of polycrystalline silicon film 3 is oxidized to form silicon dioxide film 4 which is then removed, polycrystalline silicon film 3 can be improved in crystallinity. Polycrystalline silicon film 3 serves as an active layer of a TFT.

Figure 5:
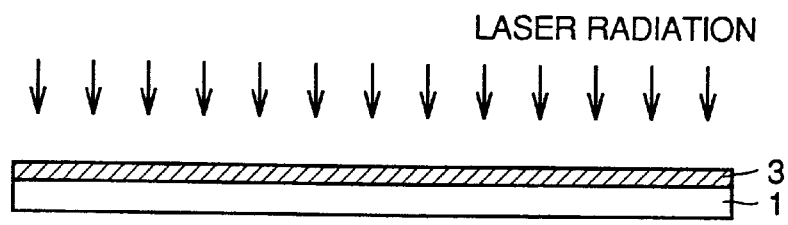

FIG. 5 shows a fifth step in which a surface of polycrystalline silicon film 3 is irradiated with KrF excimer laser beam with a wavelength λ of 248 nm to provide laser annealing. The conditions for the laser radiation are a substrate temperature of the room temperature to 600° C., a radiation energy density of 100 mJ/cm² to 500 mJ/cm² and a scanning rate of 1 mm/sec to 10 mm/sec. It should be noted that scanning can be practically provided at a scanning rate of 1 μm/sec to 100 mm/sec.

The laser beam may be XeCl excimer laser with a wavelength λ of 308 nm. The conditions for the laser radiation are a substrate temperature of the room temperature to 600° C., a radiation energy density of 100 mJ/cm² to 500 mJ/cm² and a scanning rate of 1 mm/sec to 10 mm/sec. In this example also, scanning can practically be provided at a scanning rate of 1 μm/sec to 100 mm/sec.

ArF excimer laser may also be used at a wavelength λ of 193 nm. The conditions for the laser radiation are a substrate temperature of the room temperature to 600° C., a radiation energy density of 100 mJ/cm² to 500 mJ/cm² and a scanning rate of 1 μm/sec to 10 mm/sec. In this example also, scanning can be provided at a scanning rate of 1 m/sec to 100 mm/sec.

Whichever laser beam mentioned above is used, the grain size of polycrystalline silicon film 3 is increased in proportion to radiation energy density and the frequency of radiation. Accordingly, a desired grain size can be obtained by adjusting energy density and the frequency of radiation.

Figure 13:
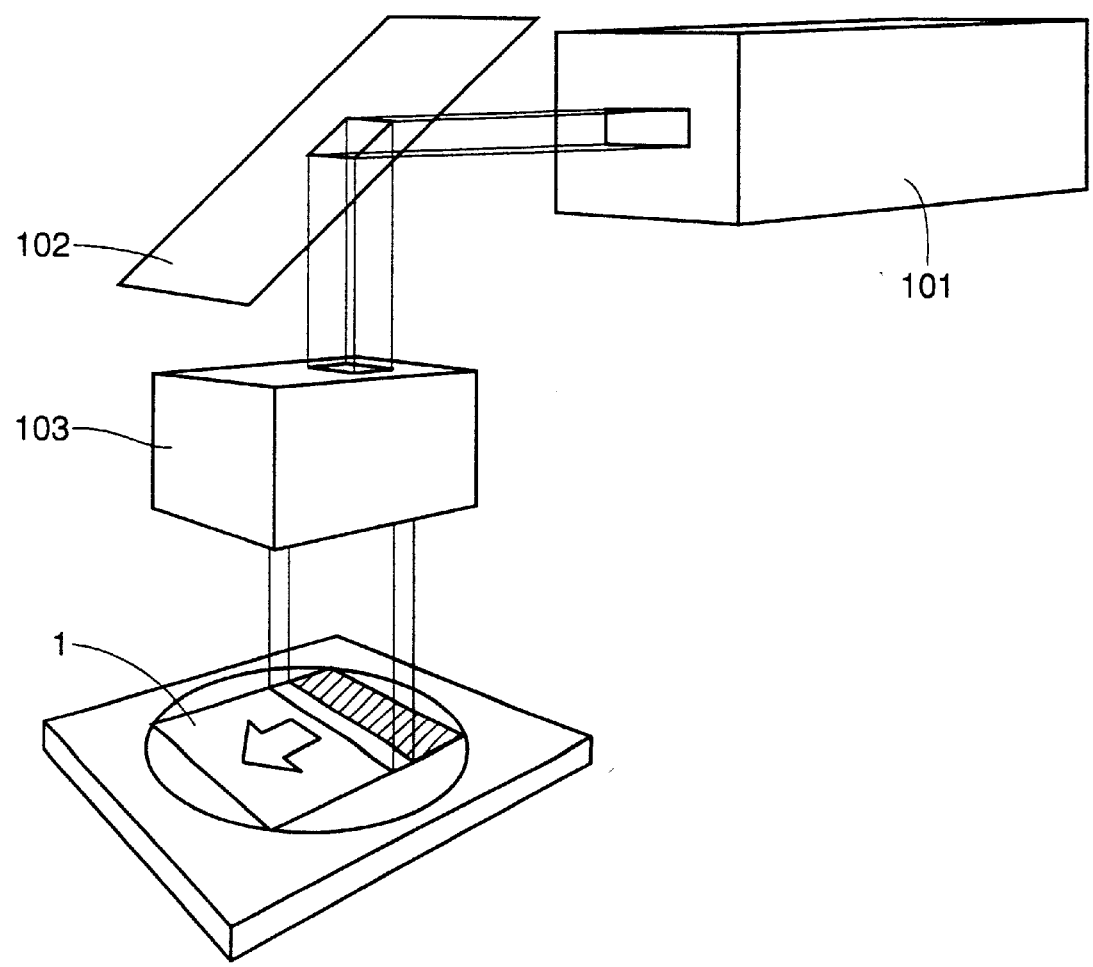
FIG. 13 is a schematic view illustrating the high throughput laser radiation employed in the present invention.

The present embodiment employs high throughput laser radiation for the excimer laser annealing described above. FIG. 13 shows a configuration of a device used for the high throughput laser radiation. The device includes a KrF excimer laser 101, a reflecting mirror 102 which reflects a laser beam from KrF excimer laser 101, and a laser beam control optical system 103 which processes a laser beam from reflecting mirror 102 into a predetermined condition and radiates the processed laser beam toward substrate 1.

In the high throughput laser radiation in such a configuration, a laser beam processed by laser beam control optical system 103 into the shape of a stick or line (of 0.5 mm×50 mm in beam size) is radiated by overlapping a plurality of pulses. The overlapping of a plurality of pulses is obtained by overlapping stick-like laser beams in the shorter axial direction by any percentage of 0% to 90%. Furthermore, stage scanning is completely synchronized with the pulse laser radiation to provide laser radiation in an extremely highly precisely overlapping condition and hence high throughput.

Figure 6:
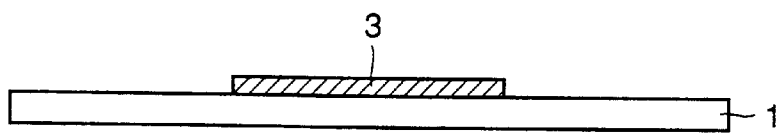

After the laser radiation through such a high throughput laser radiation as described above, the laser-radiated polycrystalline silicon film 3 is etched and patterned in a sixth step. Thus, a patterned polycrystalline silicon film 3 as shown in FIG. 6 is formed at a TFT forming location.

Figure 7:
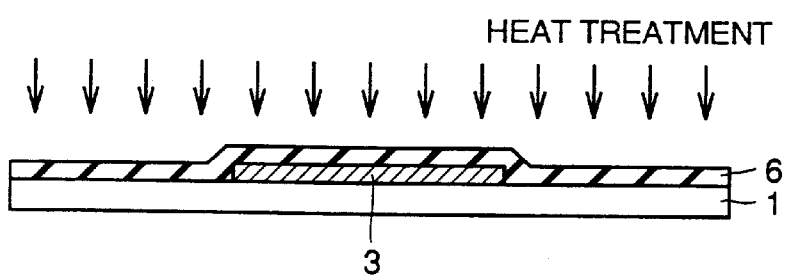

FIG. 7 shows a seventh step in which a silicon oxide film (a high temperature oxide or HTO film) serving as a gate insulating film 6 is formed on the patterned polycrystalline silicon film 3 by the LPCVD method. Then, transparent insulating substrate 1 is inserted into an electric furnace and a heat treatment is performed in $N_2$ ambient at a temperature of approximately 10–50° C. for approximately two hours. The heat treatment may be a rapid heat treatment by rapid thermal annealing (RTA). The heat treatment is performed at a temperature of approximately 900° C. to approximately 1100° C. (preferably, approximately 950° C. to 1100° C.) in $N_2$ ambient for one to ten seconds with a Xe arc lamp used as a heat source. Although the heating through the RTA method is provided at high temperature, it can be finished in an extremely short period of time and thus disadvantages can be prevented, such as deformation of transparent insulating substrate 1 while crystal defect of polycrystalline silicon film 3 and the like are reduced by the high-temperature heat treatment.

Figure 8:
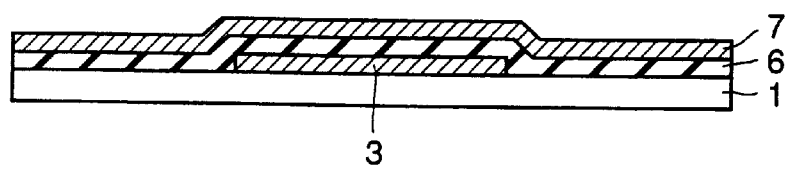

FIG. 8 shows an eighth step in which a polycrystalline silicon film 7 doped with phosphorus is formed on gate insulating film 6 by the LPCVD method. It should be noted, however, that polycrystalline silicon film 7 is not necessarily be doped with phosphorus.

Figure 9:
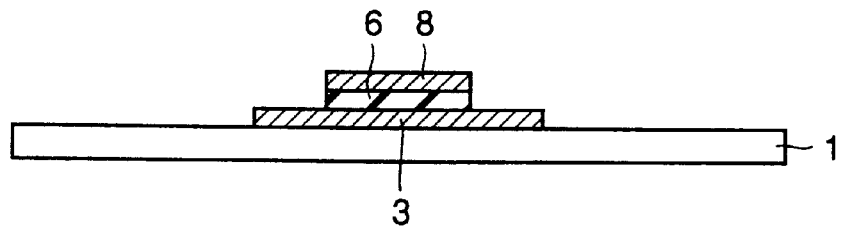

Then, photolithography and a dry etching technique according to the RIE method are employed in a ninth step to pattern polycrystalline silicon film 7 and the underlying gate insulating film 6. Thus, patterned gate electrode 8 and gate insulating film 6 are obtained on a region positioned on polycrystalline silicon film 3, as shown in FIG. 9.

Figure 10:
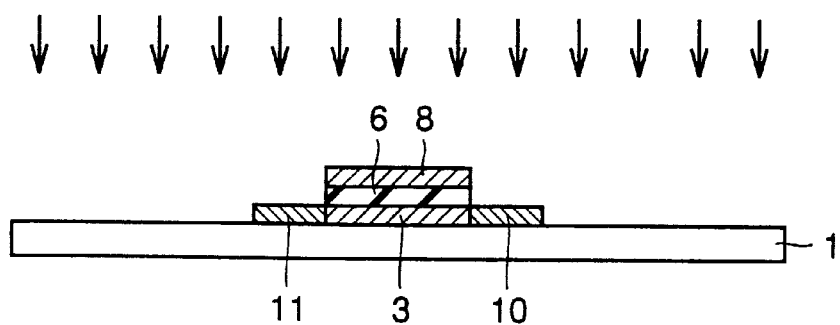

FIG. 10 shows a tenth step in which an impurity is implanted in an exposed upper surface of polycrystalline silicon film 3 and an upper surface of gate electrode 8. Furthermore, a heat treatment is provided to activate the implanted impurity. The impurity is arsenic (As) and phosphorus (P) for n type and the conditions for the implantation are approximately 80 keV and approximately $3 \times 10^{13}/cm^2$. For a p-type impurity to be implanted, boron (B) is applied and the conditions for the implantation are approximately 30 keV and approximately $1.5 \times 10^{13}/cm^2$. The impurity injection and heat treatment described above allow formation of lightly doped regions 10 and 11.

Figure 11:
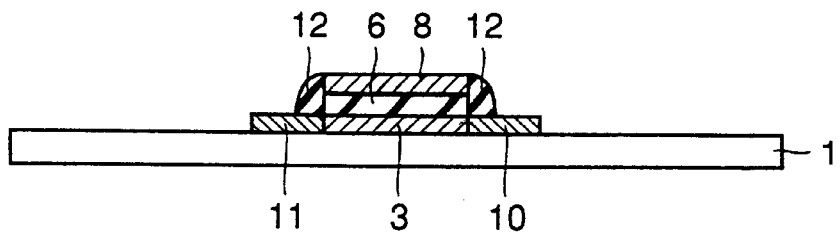

In a eleventh step, an insulating film (not shown) is then deposited on transparent insulating substrate 1 by the atmospheric pressure CVD (APCVD) method to cover polycrystalline silicon film (active layer) 3 and gate electrode 8 and then the insulating film is anisotropically etched back at the entire surface to form a sidewall 12 of the insulating film on a side surface of gate electrode 8 and gate insulating layer 6, as shown in FIG. 11.

Figure 12:
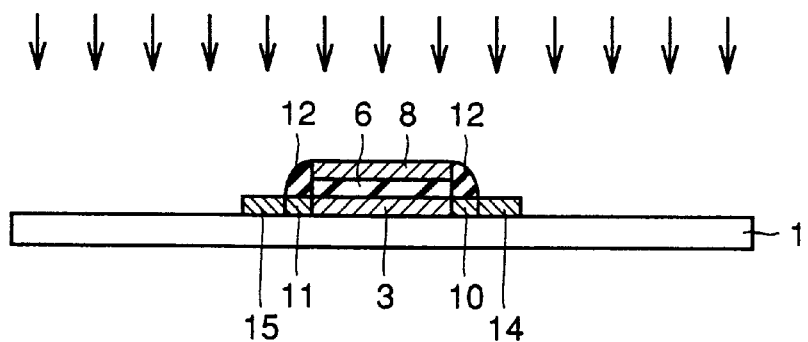

FIG. 12 shows a twelfth step in which sidewall 12 is used as a mask to implant an impurity in polycrystalline silicon film 3 so that heavily doped regions 14 and 15 are formed in self-alignment. For a n-type impurity to be implanted, phosphorus (P) ions are applied and the conditions for the implantation are approximately 80 keV and approximately $3\times10^{15}/cm^2$. In this state, an electric furnace is also used to provide a heat treatment to activate the impurity. This heat treatment is performed at approximately 850° C. for approximately 30 minutes at a $N_2$ gas flow rate of approximately 5 l/min.

It should be noted that the heat treatment may be a rapid heat treatment by the RTA method and is performed at a temperature of approximately 700° C. to approximately 950° C. in $N_2$ ambient for one to three seconds with a Xe arc lamp used as a heat source. Although the heating through the RTA method is provided at high temperature, it can be finished in an extremely short period of time and thus transparent insulating substrate 1 can be effectively prevented from being deformed while crystal defect of polycrystalline silicon film 3 or the like is reduced by the high-temperature heat treatment. Thus, source/drain regions are formed of a lightly-doped drain (LDD) structure formed of lightly doped regions 10 and 11 and heavily doped regions 14 and 15.

The process described above thus allows formation of a TFT which employs a polycrystalline silicon film as an active layer.

Other than the lasers used in the first embodiment, $F_2$ laser (wavelengths: 157 nm), ArF laser (wavelength: 193 nm), KrCl laser (wavelength: 222 nm), XeBr laser (wavelength: 282 nm), XeCl laser (wavelength: 308 nm) and XeF laser (wavelength: 351 nm) can be used as excimer laser. These excimer lasers can achieve similar effects to the lasers used in the fifth step of the first embodiment.

Furthermore, $Ar^+$ laser (wavelength: 488 or 515 nm), ruby laser (wavelength: 694 nm), YAG laser (wavelength: 1.06 $\mu$m) and $CO_2$ laser (wavelength: 10.6 $\mu$m) can also be used other than the above excimer lasers. It should be noted, however, that the above excimer lasers are preferably used to achieve efficient absorption thereof into polycrystalline silicon film 3.

Furthermore, ultra high pressure mercury lamp, low pressure mercury lamp, deuterium lamp, halogen lamp, Fe/Hg metal halogen lamp and the like can also be used as high energy beam.

These high energy beams are preferably of a wavelength of no more than approximately 600 nm, which is readily absorbed in silicon film.

Figure 14:
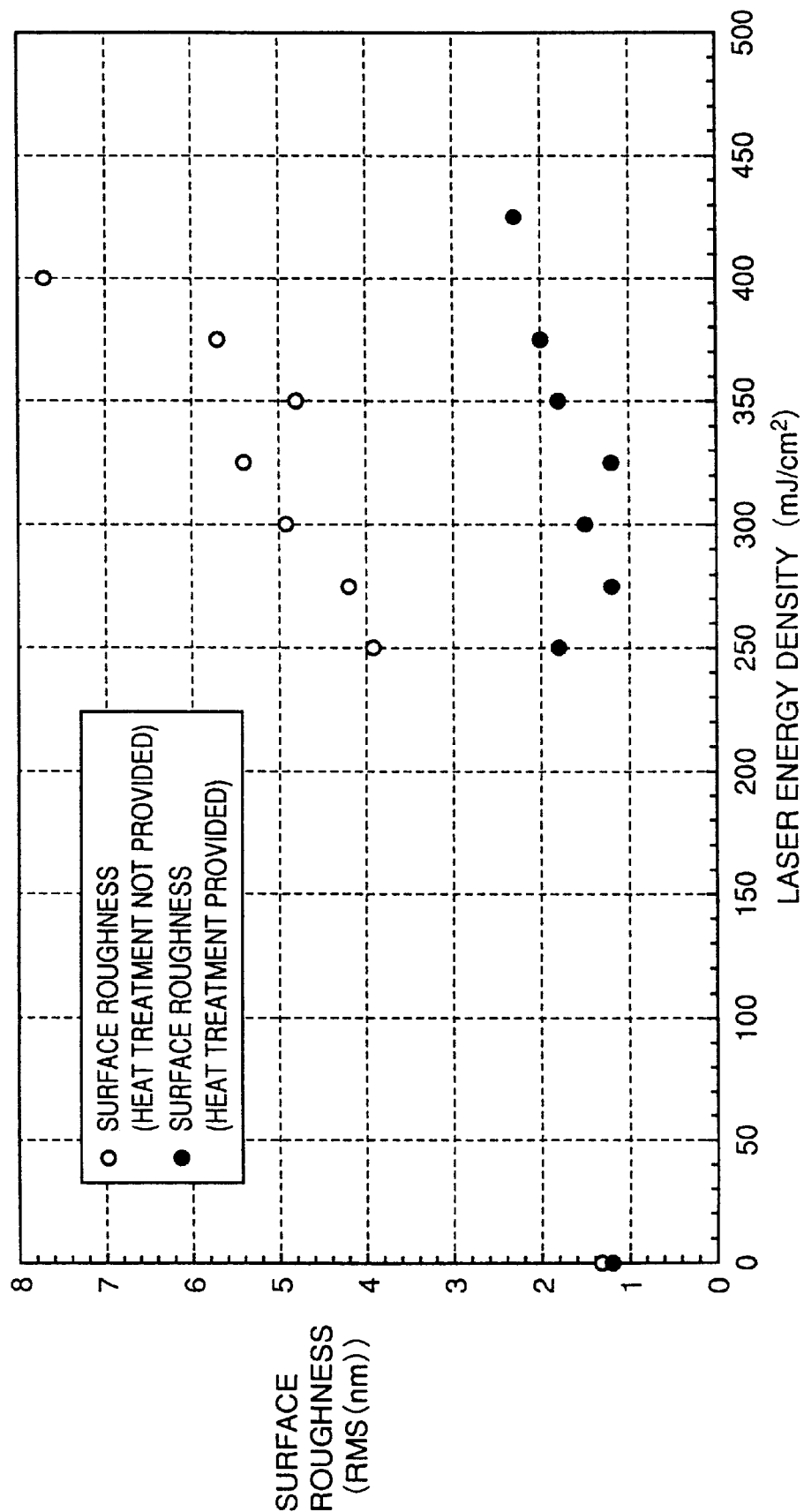
FIGS. 14–16 are diagrams representing characteristics of a semiconductor film of the present invention.

An effect of the heat treatment in the seventh step shown in FIG. 7 will now be described. In the seventh step, a transparent insulating substrate 1 is inserted into an electric furnace for a heat treatment in $N_2$ ambient at approximately 1050° C. for approximately two hours. This can reduce the roughness of a surface of polycrystalline silicon film 3 serving as an active layer of a TFT. FIG. 14 is a graph representing a roughness of a surface of polycrystalline silicon film with and without the heat treatment in the seventh step after the laser radiation toward the polycrystalline silicon film. In FIG. 14, the horizontal axis represents the energy density of the laser to be radiated and the vertical axis represents the roughness of the surface of the polycrystalline silicon film, and a white circle (○) represents a case without the heat treatment after the laser radiation and a black circle (●) represents a case with the heat treatment after the laser radiation.

As shown in FIG. 14, the surface roughness after solid phase crystallization of an amorphous silicon film is approximately 1.2 nm to approximately 1.3 nm in any example. As laser radiation density is increased, it is found that the roughness is increased in the example without the heat treatment whereas the roughness is not so increased in the example with the heat treatment.

Figure 15:
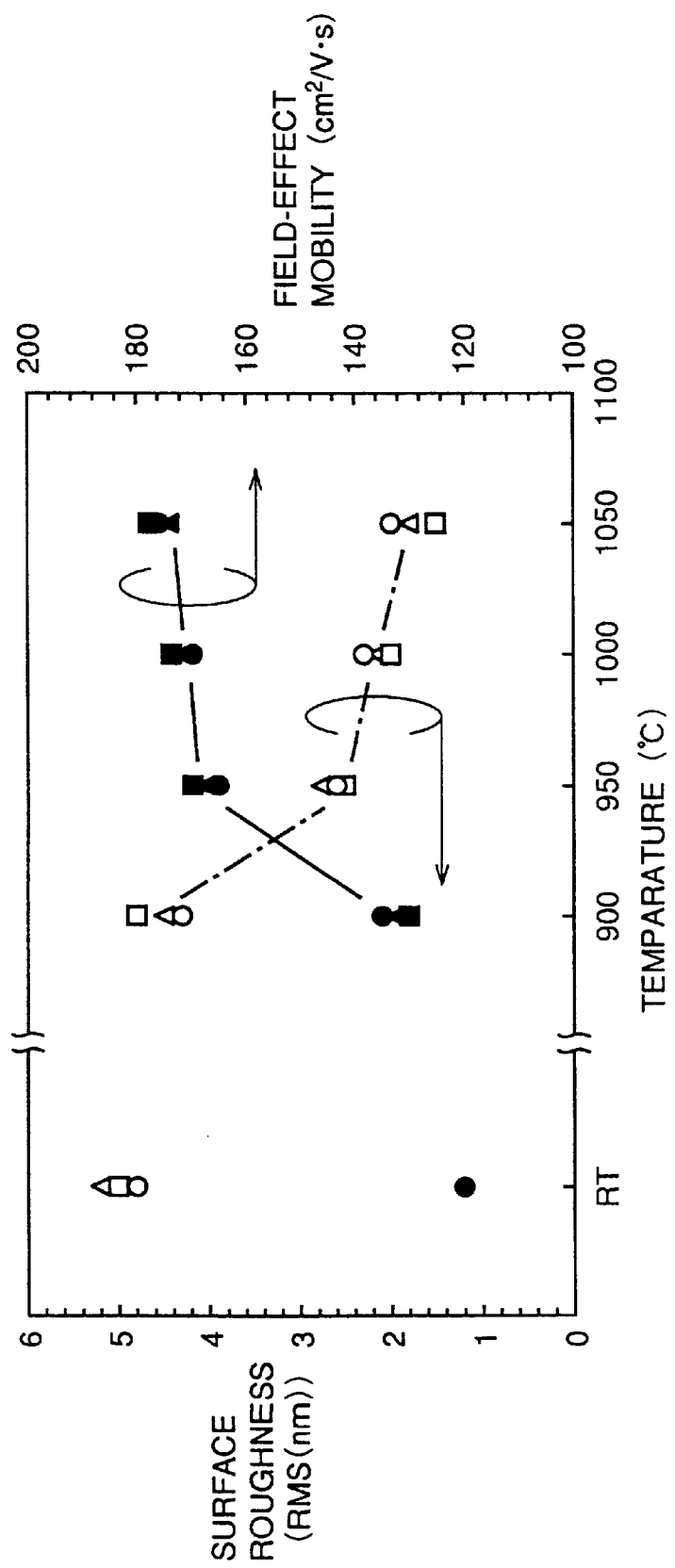

FIG. 15 is a graph representing surface roughness and field-effect mobility relative to the temperature at the heat treatment in the seventh step. In FIG. 15, ○, △ and □ indicate the changes in surface roughness relative to the changes of temperature and ●, ▲ and ■ indicate field-effect mobility relative to the changes of temperature. It is found that when the temperature is no less than 900° C., surface roughness is reduced and field-effect mobility is increased as the temperature is raised. The temperature of the heat treatment is preferably no more than 1100° C., otherwise the transparent insulating substrate will be disadvantageously deflected within the treatment time. It is thus found that the temperature of the heat treatment is preferably approximately 900° C. to approximately 1100° C., more preferably approximately 950° C. to approximately 1100° C.

The heat treatment thus performed in the seventh step after the laser radiation toward polycrystalline silicon film (active layer) 3 can reduce the surface roughness of polycrystalline silicon film 3 and thus improve the field-effect mobility of a TFT with such a polycrystalline silicon film 3 used as an active layer. Furthermore, use of such a TFT in an LCD allows good display.

Figure 16:
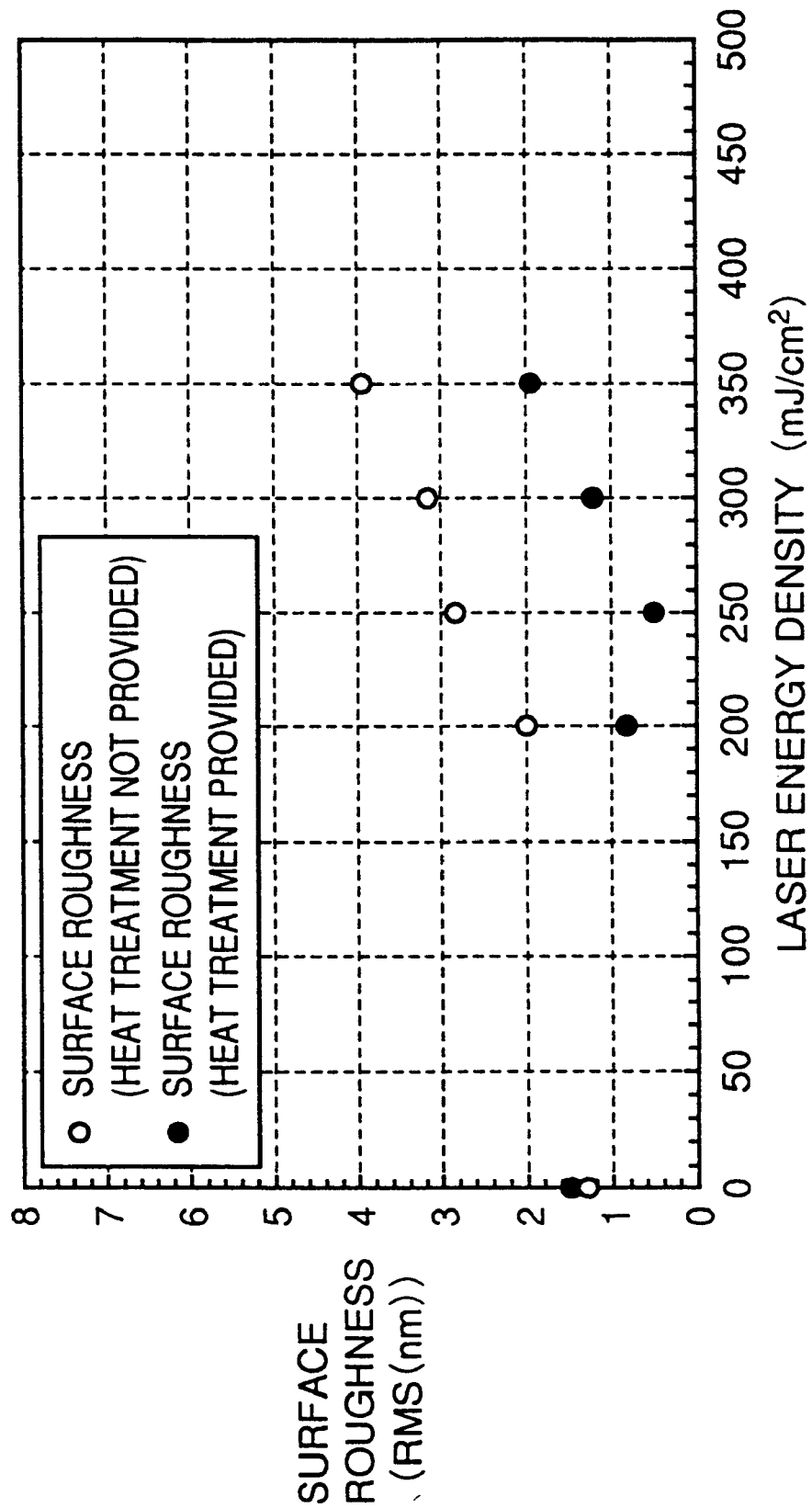

FIG. 16 is a graph indicating the surface roughnesses of polycrystalline silicon film in an example in which heating is provided during laser radiation and in a conventional example in which heating is not provided during laser radiation. In FIG. 16, the horizontal axis represents laser energy density and the vertical axis represents the surface roughness of the polycrystalline silicon film, and a white circle (○) indicates an example in which a heat treatment (i.e., heating) is provided during laser radiation and a black circle (●) indicates an example in which a heat treatment is provided during laser radiation.

As shown in FIG. 16, the surface roughness after amorphous silicon is subjected to solid phase crystallization is approximately 1.0 nm to 2.0 nm in either example.

As radiation density is changed, the surface roughness of the example in which heating is provided during laser radiation can be smaller than the initial state, whereas the surface roughness of the example in which heating is not provided during laser radiation increases as laser energy density is increased.

It is thus found that the laser radiation toward polycrystalline silicon film 3 while it is heated can reduce the surface roughness of polycrystalline silicon film 3. This can improve the field-effect mobility of a TFT with such a polycrystalline silicon film 3 used as an active layer. Furthermore, use of such a TFT in a LCD allows good display. While the temperature of the substrate heated during laser radiation is approximately 400° C. in the fifth step of the first embodiment, a temperature of approximately no less than 100° C. can also achieve a similar effect. It should be noted, however, that the temperature of the substrate heated during laser radiation is preferably no more than 600° C. if prevention of deflection of transparent insulating substrate 1 is taken into consideration.

Figure 17:
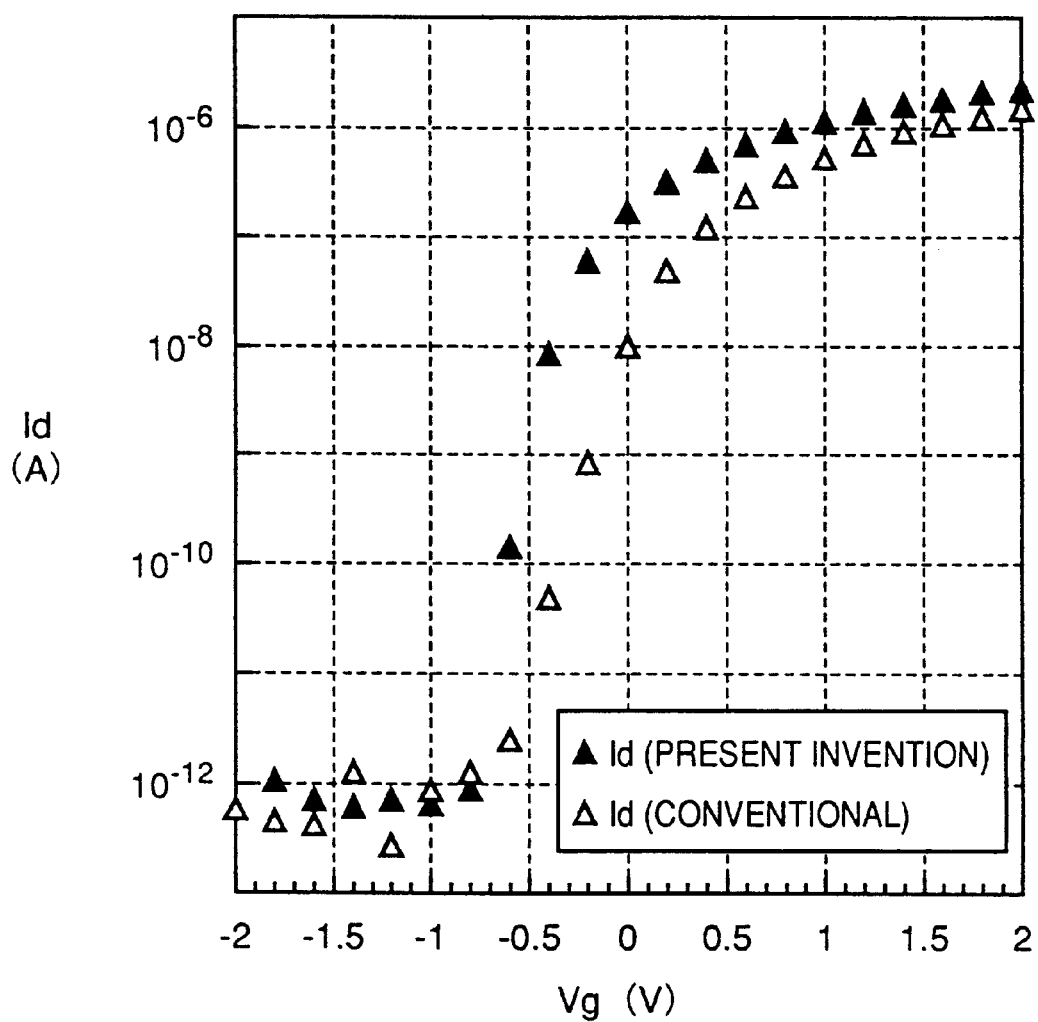
FIGS. 17–19 are graphs representing characteristics of a TFT which employs a semiconductor film of the present invention.

FIG. 17 is a graph representing the Id-Vg characteristic of a TFT formed by the manufacturing process according to the first embodiment and that of a conventional TFT. In FIG. 17, the horizontal axis represents a voltage Vg applied to the gate electrode and the vertical axis represents a current Id flowing to the drain. It is found that current Id in a curve line in the on state is larger in the TFT according to the first embodiment than in the conventional TFT, as shown in FIG. 17. In other words, it is found that the field-effect mobility of electrons of an active layer formed of the polycrystalline silicon film according to the first embodiment is improved as compared with a conventional field-effect mobility.

It is also found from FIG. 17 that the drain current Id flowing at a low gate voltage Vg immediately after the TFT is turned on is larger in the TFT according to the first embodiment than in the conventional TFT. This indicates that the surface roughness of the active layer of the semiconductor device according to the first embodiment is smaller than that of the conventional TFT active layer.

It is found from the results shown in FIGS. 14 to 17 that both the heating during laser radiation in the fifth step and the heat treatment in the seventh step after the laser radiation can reduce the surface roughness of polycrystalline silicon film 3. It is also found that use of such a polycrystalline silicon film 3 as an active layer of a TFT can further improve the characteristics, such as field-effect mobility. More specifically, the characteristics of semiconductor devices can be improved, such as the field-effect mobility, subthreshold (S) value and threshold (Vth) value of the TFT.

Figure 18:
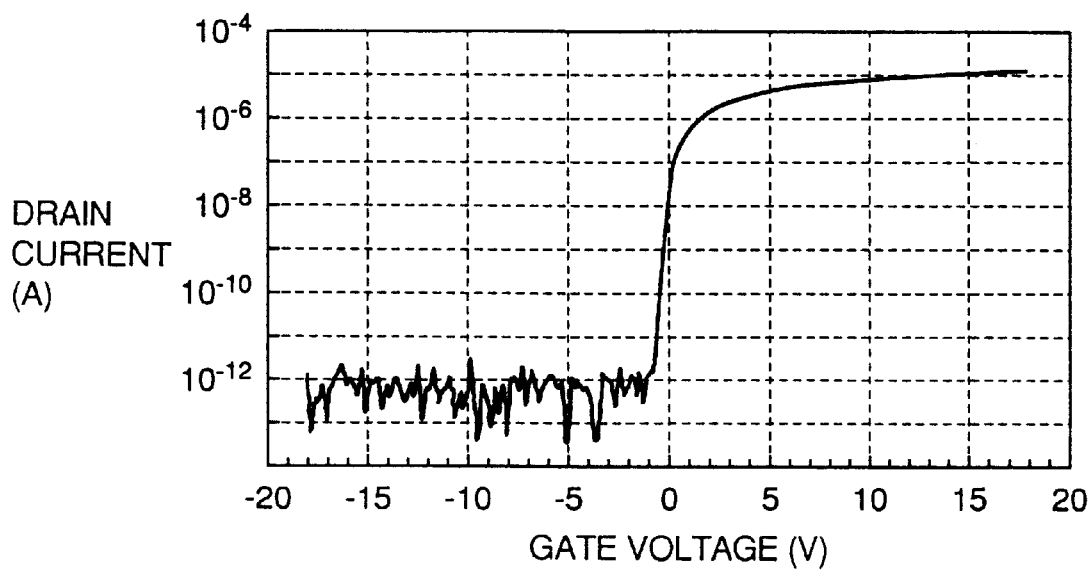
Figure 19:
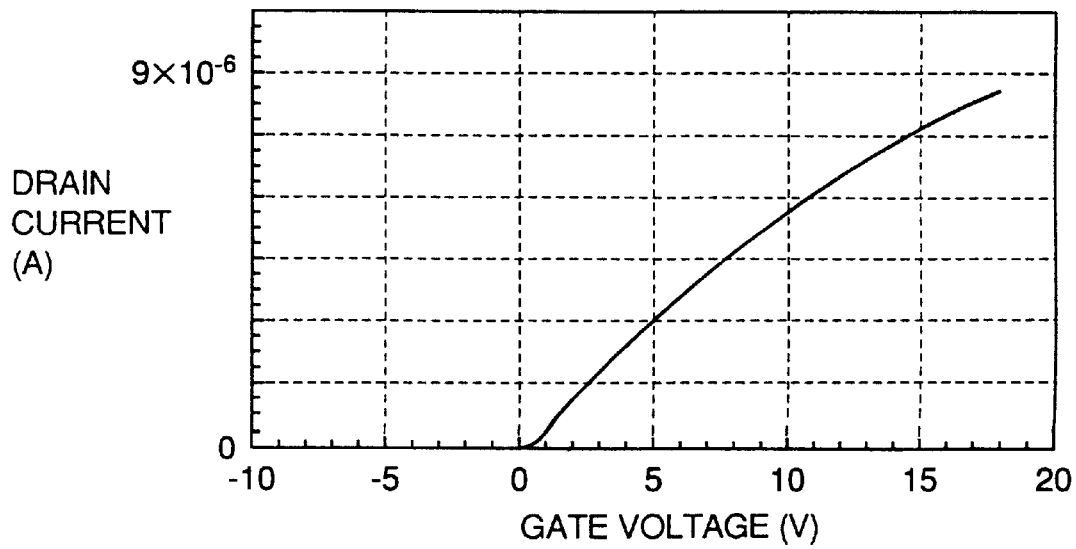
Figure 20:
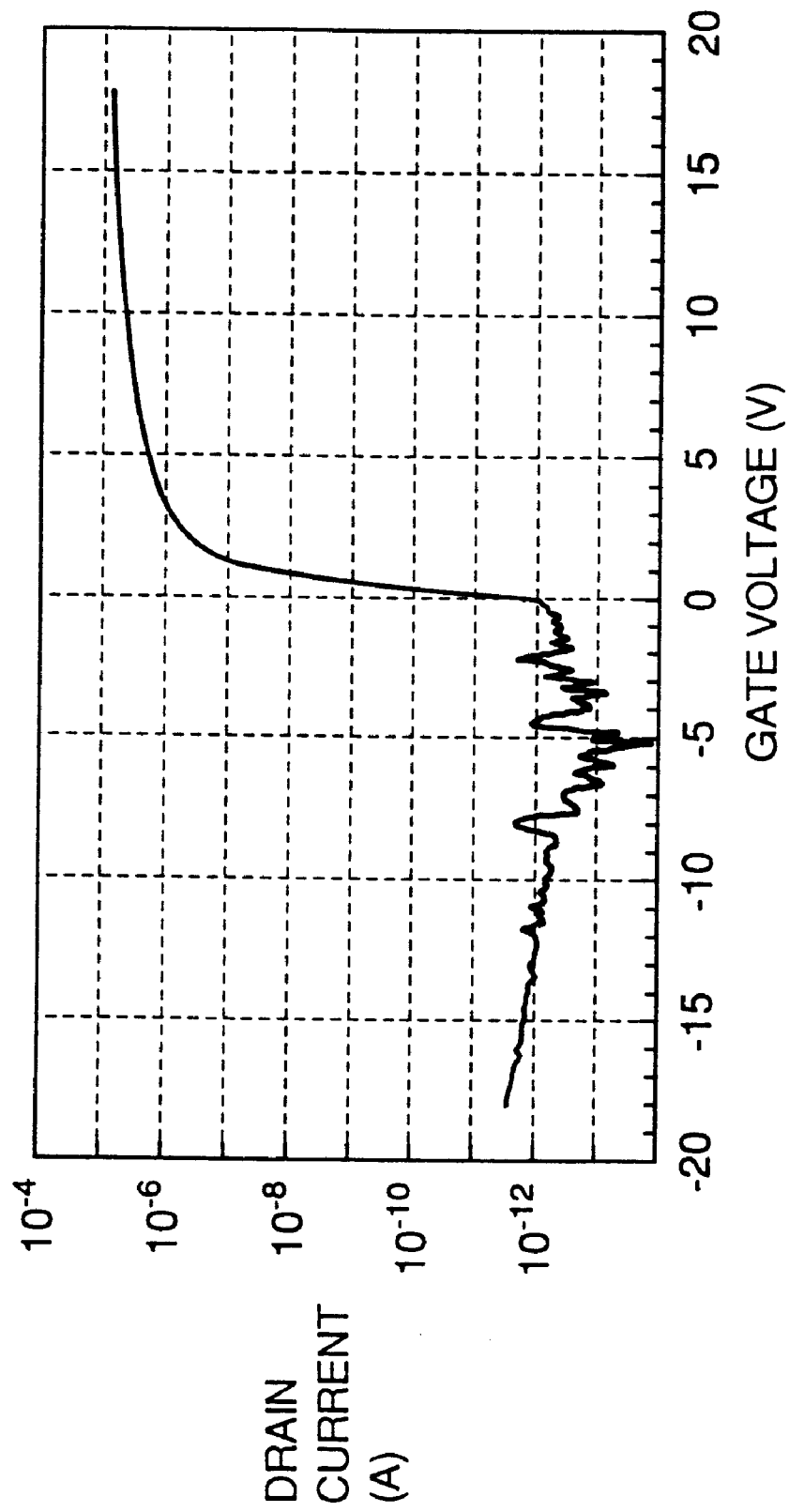
FIGS. 20–21 are graphs representing characteristics of a conventional TFT.
Figure 21:
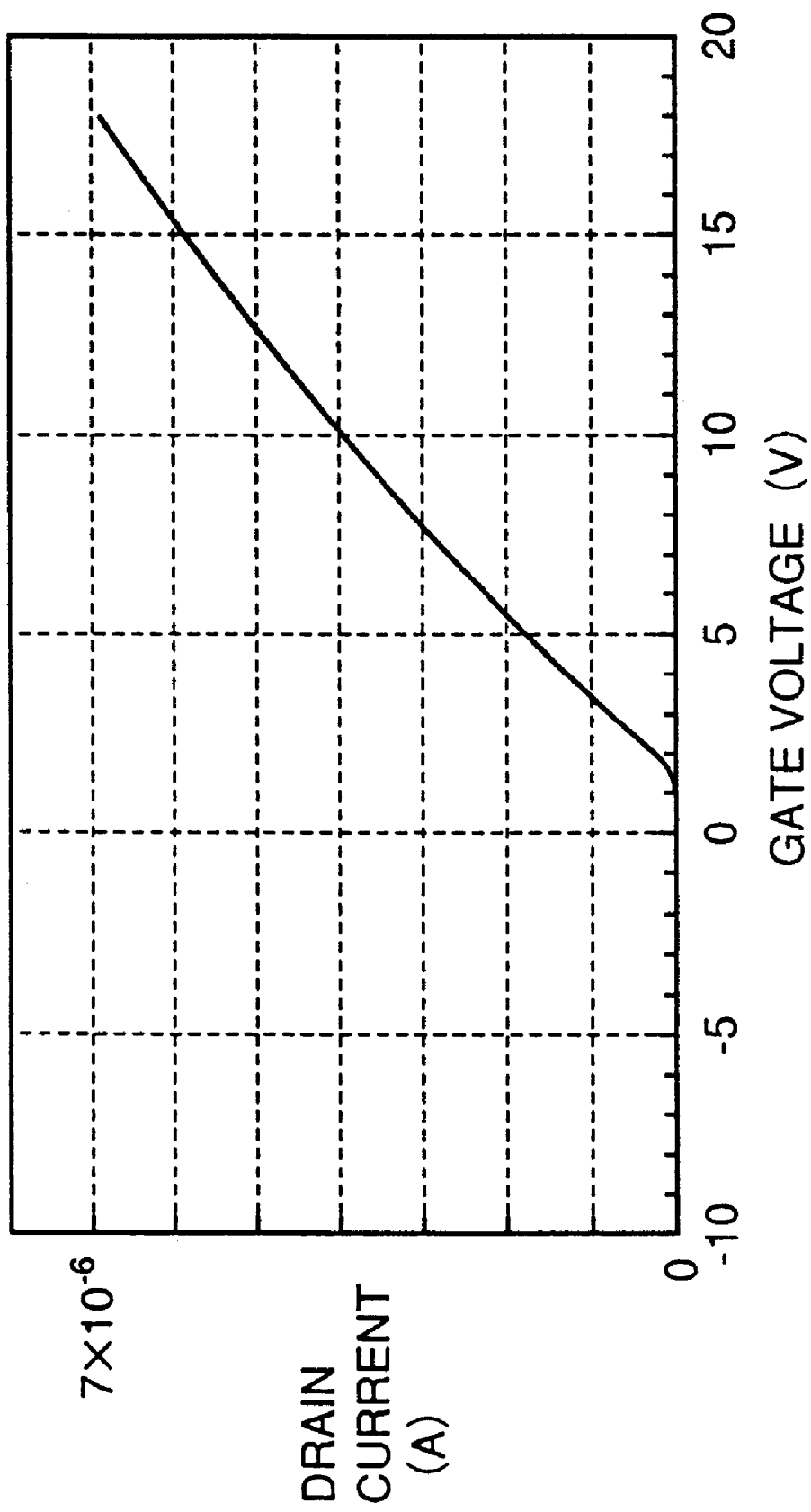

The characteristics of the TFT will further be described which is formed by the manufacturing process according to the first embodiment shown in FIGS. 1–12. FIGS. 18 and 19 represent the Id-Vg characteristic of a TFT according to the first embodiment, and FIGS. 20 and 21 represent the Id-Vg characteristic of a conventional TFT. In FIGS. 18–21, the horizontal axis represents a voltage Vg applied to the gate and the vertical axis represents a current Id flowing to the drain. It is found that the drain current Id of the TFT according to the first embodiment shown in FIG. 19 is larger than that of the conventional TFT shown in FIG. 21. This means that the field-effect mobility of electrons in an active layer formed of the polycrystalline silicon film according to the first embodiment is improved as compared with a conventional field-effect mobility.

Figure 22:
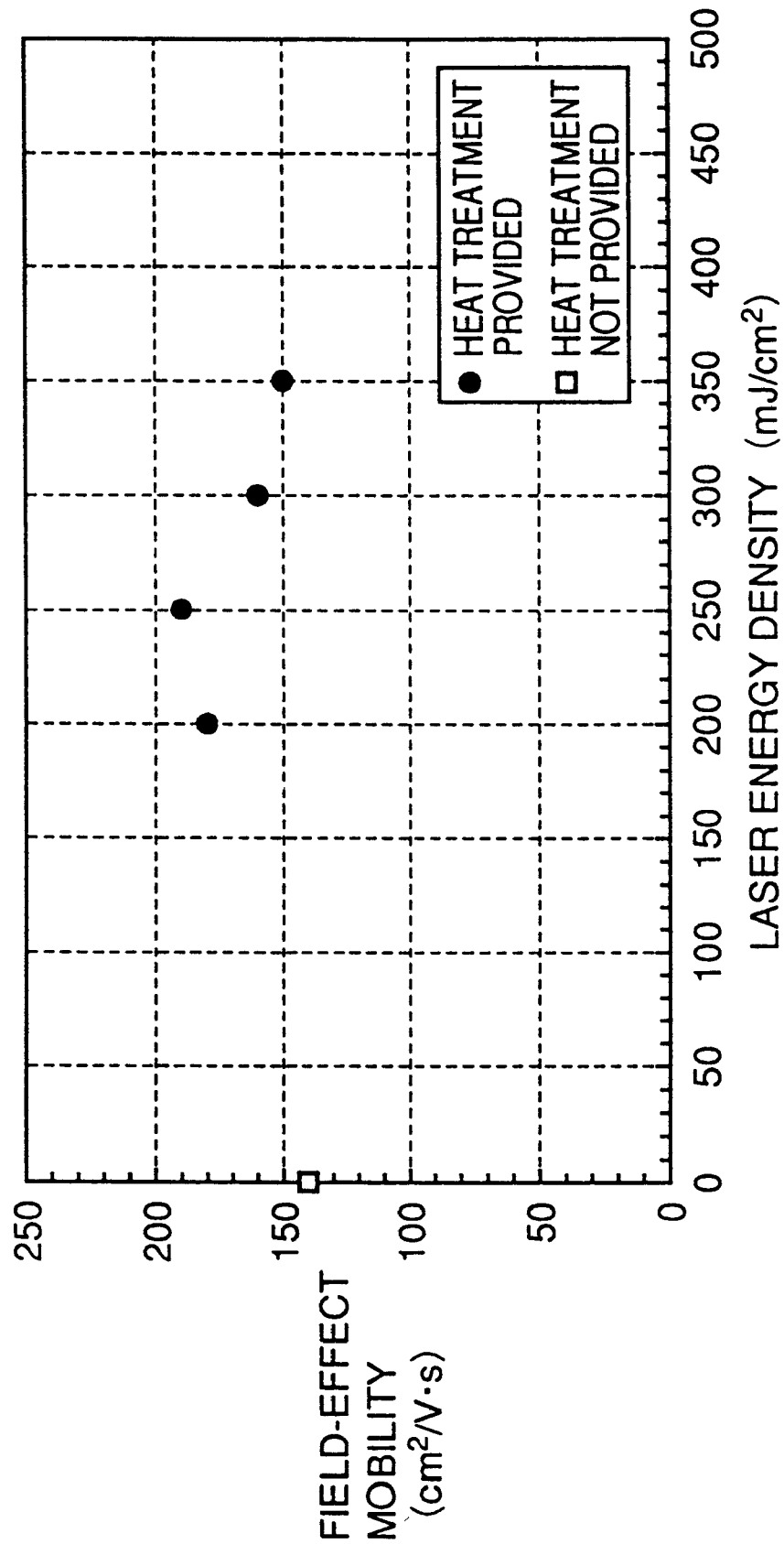
FIG. 22 is a graph representing a characteristic of a TFT which employs a semiconductor film of the present invention.

FIG. 22 shows a correlation between the field-effect mobility of carrier in a polycrystalline silicon film and excimer laser radiation energy density after both the heating during laser radiation in the fifth step and the heat treatment in the seventh step after the laser radiation. It is found from FIG. 22 that as excimer laser radiation energy density is increased, field-effect mobility is also increased, peaks with an energy density of approximately 250 mJ/cm$^2$ and gradually reduces thereafter. Such a peak is resulted from a trade-off relationship between the improvement in crystallinity owing to excimer laser radiation and surface roughness. The relationship between the improvement in crystallinity and surface roughness is best maintained around the peak and good field-effect mobility can thus be obtained.

Figure 23:
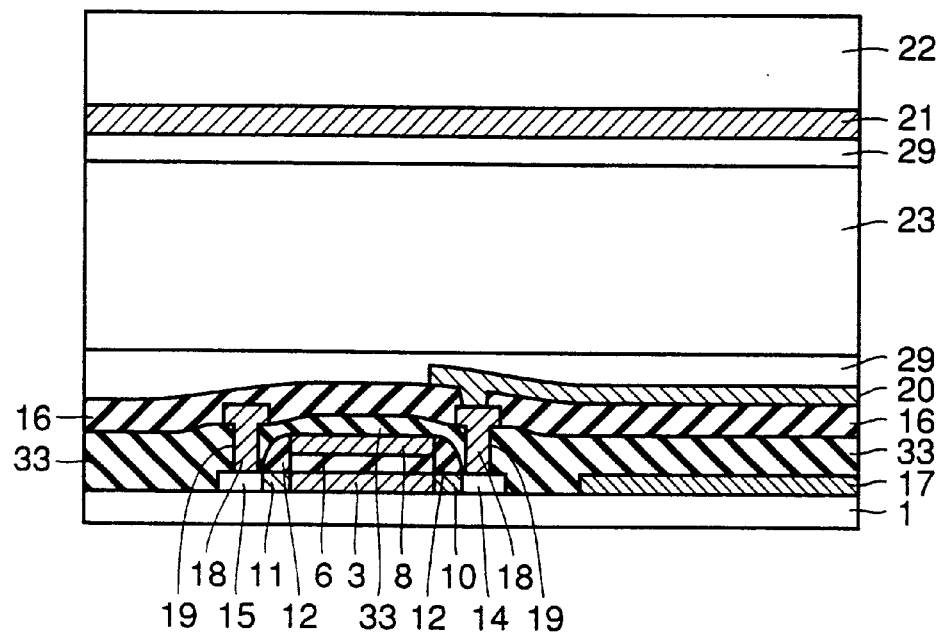
FIG. 23 is a cross section of an LCD with application of a TFT according to the first embodiment.

Referring now to FIG. 23, a process will now be described for manufacturing an LCD incorporating a TFT formed by the manufacturing process according to the first embodiment.

The TFT according to the first embodiment shown in FIG. 12 is first formed and then sputtering is applied to form a storage electrode 17 constituting an auxiliary capacitance that is formed of indium thin oxide (ITO) on a region of a pixel portion of transparent insulating substrate 1. Storage electrode 17 may be formed simultaneously with the formation of the phosphorus-doped polycrystalline silicon film 3 which will serve as an active layer of the TFT.

Then, an interlayer insulating film 33 is formed on the entire surface of the device. Silicon oxide film, silicate glass or silicon nitride film is used as the material of interlayer insulating film 33. These films are formed by the CVD method or the PCVD method. Then, a contact hole 19 which reaches heavily doped regions 14 and 15 is formed in interlayer insulating film 33. Then, an AlSi film (not shown) which fills contact hole 19 and extends along an upper surface of interlayer insulating film 33 is formed and then patterned to form a source/drain electrode 18. Furthermore, an interlayer insulating film 16 is formed to cover interlayer insulating film 33 and source/drain electrode 18 and then a contact hole is formed in a region of interlayer insulating film 16 that is positioned over one source/drain electrode 18. An ITO film (not shown) which fills the contact hole and extends along an upper surface of interlayer insulating film 16 is formed and then patterned to form a display electrode 20. An orientation film 29 is formed on display electrode 20 and interlayer insulating film 16 to complete the substrate on the TFT side.

Then, transparent insulating substrate 1 with the TFT of polycrystalline silicon formed thereon is opposed to a transparent insulating substrate 22 with a common electrode 21 and an orientation film 29 formed on a surface thereof. In this state, liquid crystal is sealed in between transparent insulating substrates 1 and 22 to form a liquid crystal layer 23 to complete the formation of the pixel portion of an LCD. An LCD is thus formed which employs the TFT according to the first embodiment.

Figure 24:
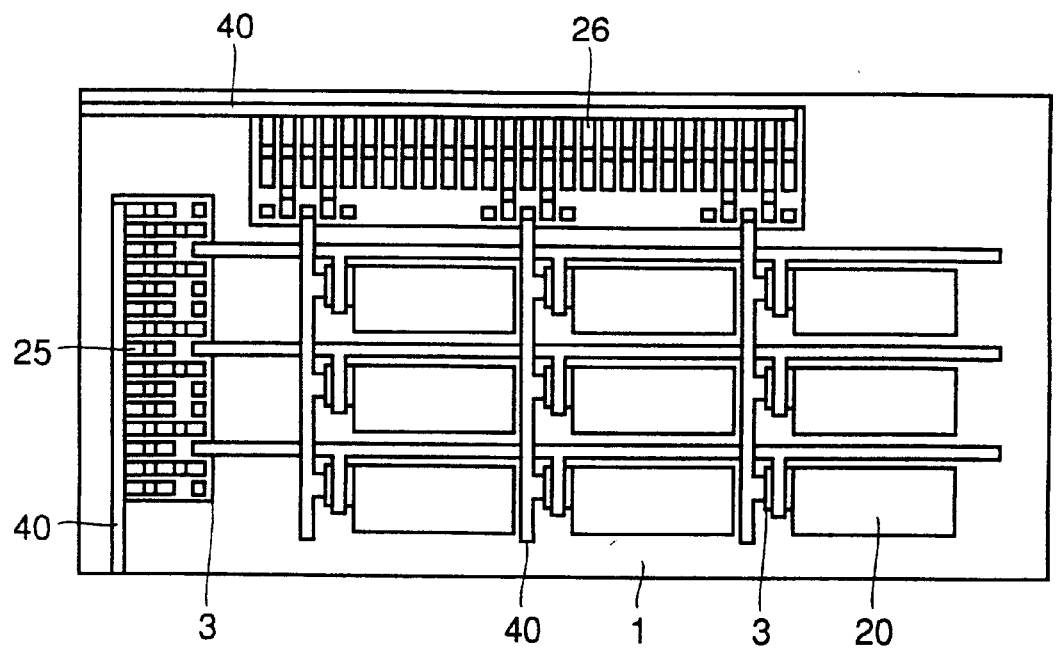
FIG. 24 is a plan view of a liquid crystal display panel with a display pixel portion and a peripheral drive circuit formed on the same substrate.

FIG. 24 shows a liquid crystal display panel in which a display pixel portion and a peripheral drive circuit portion are formed on the same substrate. In the liquid crystal display panel shown in FIG. 24, an active layer of the peripheral drive circuit portion (a gate driver 25 and a drain driver 26) and an active layer of the display pixel portion are constituted by polycrystalline silicon film 3 formed by the process according to the present embodiment. The display pixel portion has a plurality of display electrodes 20 arranged in a matrix. Display electrodes 20 are connected by signal interconnection 40. Gate driver 25 and drain driver 26 are also each connected to signal interconnection 40.

Figure 25:
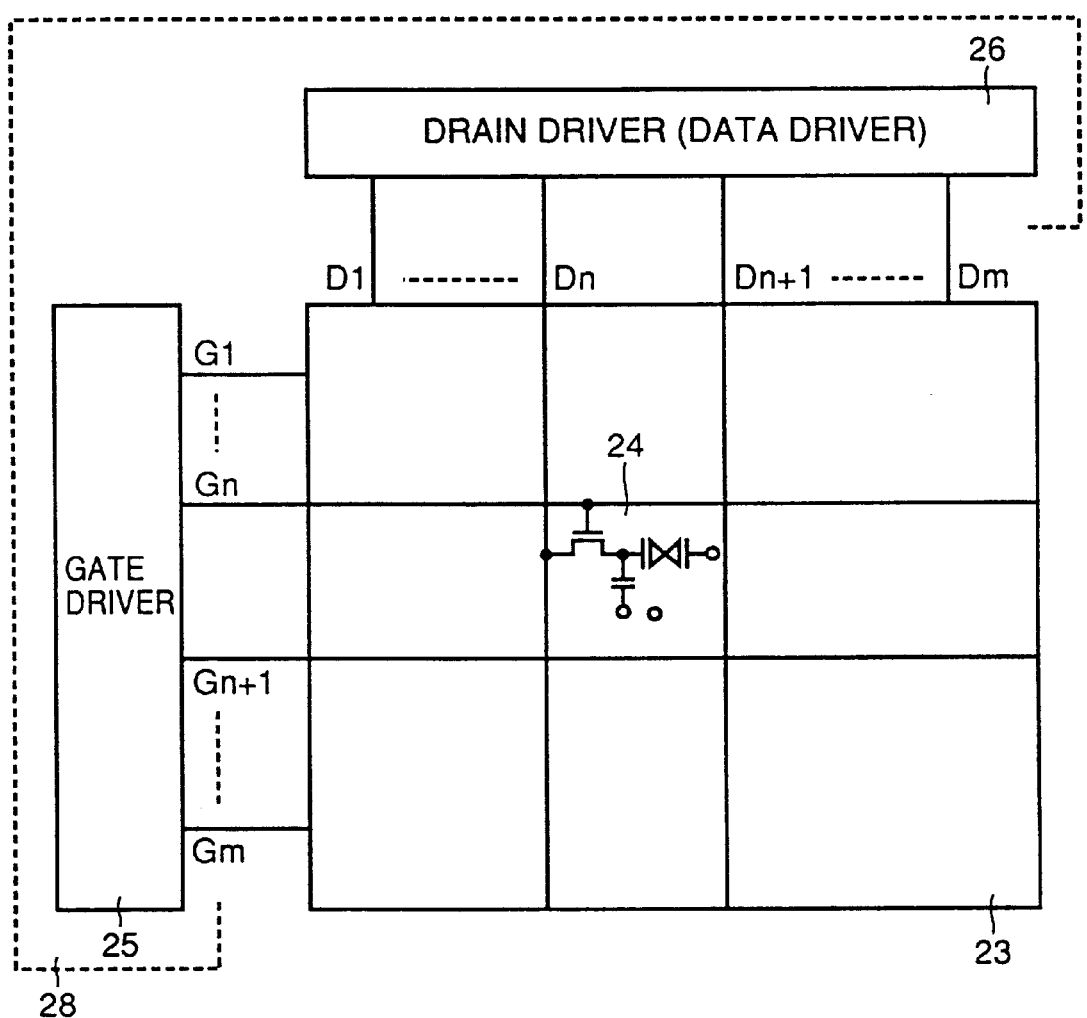
FIG. 25 is a block diagram showing a circuit configuration of an LCD of the present invention.

FIG. 25 is a block configuration diagram of an LCD of active matrix type to which a TFT according to the first embodiment is applied. Referring to FIG. 25, each scanning line (gate interconnection) G1 . . . Gn, Gn+1 . . . Gm and each data interconnection (drain interconnection)D1 . . . Dn, Dn+1 . . . Dm are arranged in a pixel portion 24. Each gate interconnection and each drain interconnection intersect perpendicular to each other and pixel portion 24 is provided at the intersection. Each gate interconnection is connected to gate driver 25 to receive a gate signal (a scan signal). Each drain interconnection is connected to drain driver (data driver) 26 to receive a data signal (a video signal). Gate driver 25 and drain driver 26 configure peripheral drive circuit portion 28.

An LCD in which pixel portion 24 and at least one of gate driver 25 and drain driver 26 are formed on the same substrate is generally referred to as a driver-integrating (or driver-incorporating) LCD. It should be noted that gate driver 25 can be provided at both sides of pixel portion 24 and that drain driver 27 can be provided at both sides of pixel portion 24.

In the LCD shown in FIG. 25, the TFT formed of the polycrystalline silicon film according to the first embodiment is applied to not only a pixel driving element of pixel portion 24 but also a switching elements of peripheral drive circuit 28. In manufacturing it, a TFT used for pixel portion 24 and a TFT used for peripheral drive circuit portion 28 are formed on a same substrate in parallel. It should be noted that TFT including the polycrystalline silicon film of peripheral drive circuit portion 28 adopts the normal single drain structure rather than LDD structure, although it may adopt LDD structure.

Furthermore, if the TFT of polycrystalline silicon film of peripheral drive circuit portion 28 is formed in CMOS configuration, a TFT forming region can be reduced, which can in turn reduce gate driver 25 and drain driver 26 forming regions to contemplate high integration.

Figure 26:
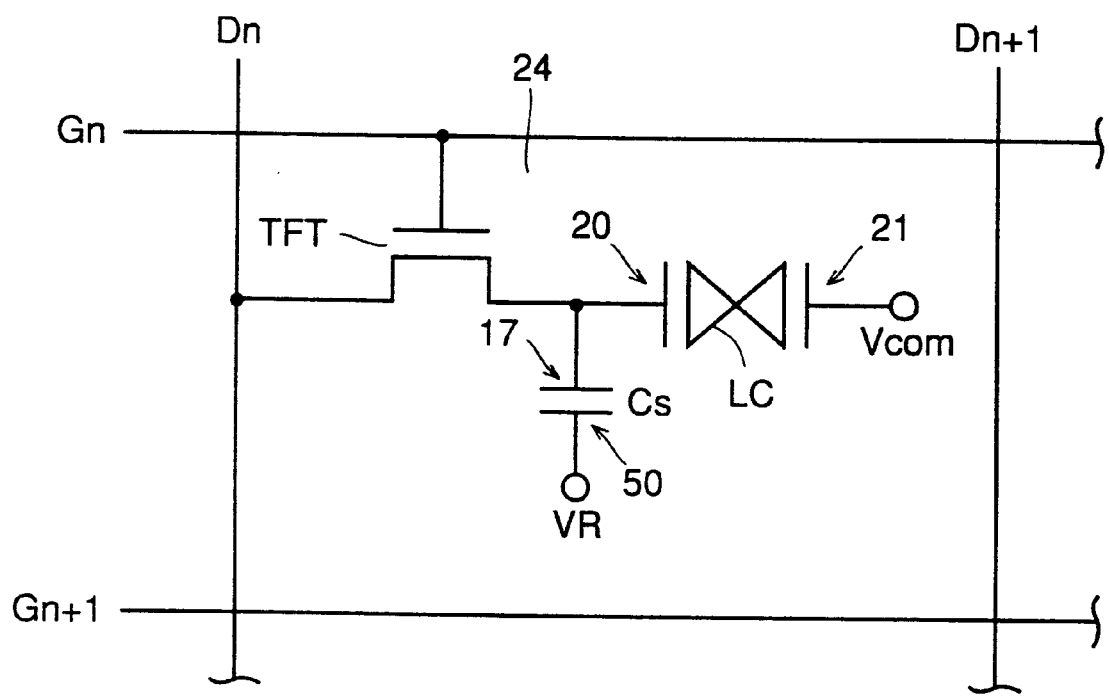
FIG. 26 is an equivalent circuit diagram of an LCD according to the present invention.

FIG. 26 shows a circuit equivalent to a pixel portion provided at a perpendicular intersection of gate interconnection Gn and drain interconnection Dn. Referring to FIG. 26, pixel portion 24 is configured of a TFT as a pixel driving element, a liquid crystal cell LC, and an auxiliary capacitance Cs. Gate interconnection Gn is connected to the gate of the TFT, and drain interconnection Dn is connected to the drain of the TFT. The source of the TFT is connected to display electrode (pixel electrode) 20 of liquid crystal cell LC and to auxiliary capacitance electrode (storage electrode or load capacitance electrode) 17.

Liquid crystal cell LC and auxiliary capacitance Cs configure a signal storage element. A common electrode 21 (an electrode opposite to display electrode 20) of liquid crystal cell LC receives a voltage Vcom. An electrode 50 of auxiliary capacitance Cs that is opposed to the electrode connected to the source of the TFT (i.e., an opposite electrode) receives a constant voltage VR. Common electrode 21 of liquid crystal cell LC is a common electrode with respect to all pixel portions 24. Electrostatic capacitance is formed between display electrode 20 and common electrode 21 of liquid crystal cell LC. It should be noted that opposite electrode 50 in auxiliary capacitance Cs can be connected to the adjacent gate interconnection Gn+1.

In operation, the TFT in pixel portion 24 configured as described above is turned on when a positive voltage is applied to gate interconnection Gn and hence to the gate of the TFT. In this state, the electric charge corresponding to a data signal provided to drain interconnection Dn is charged in the electrostatic capacitance of liquid crystal LC and in auxiliary capacitance Cs. The TFT is turned off when a negative voltage is applied to gate interconnection Gn and hence to the gate of the TFT. In this state, a voltage which has been applied to drain interconnection Dn is held by the electrostatic capacitance of liquid crystal cell LC and in auxiliary capacitance Cs. Thus, a data signal to be written into pixel portion 24 can be provided to the drain interconnection and the voltage of the gate interconnection can be controlled to hold any data signal in pixel portion 24. In response to the data signal held in pixel portion 24, the transmissitivity of liquid crystal cell LC is changed to display an image.

Second Embodiment

Figure 27:
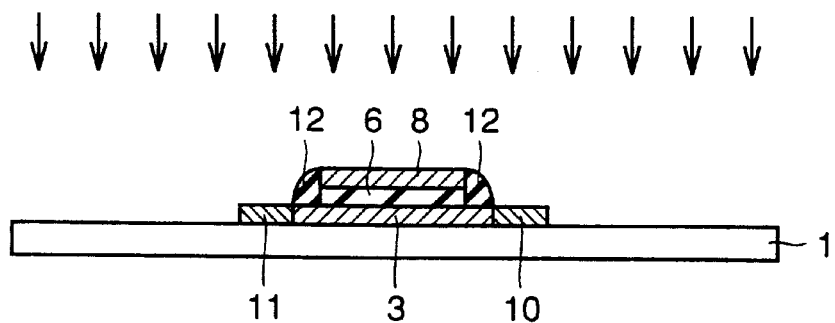
FIGS. 27 and 28 are cross sections illustrating a process for manufacturing a semiconductor device (a TFT) according to a second embodiment of the present invention.
Figure 28:
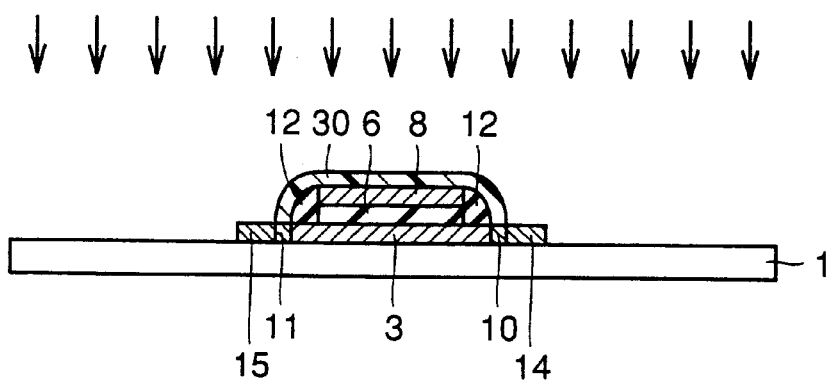

A manufacturing process according to a second embodiment will now be described with reference to FIGS. 27 and 28. According to the manufacturing process of the second embodiment, an offset structure is formed in a TFT formed by the manufacturing method according to the first embodiment shown in FIGS. 8–12. Such a formation of an offset structure does not include the impurity injection at the tenth step of the first embodiment shown in FIG. 10 but impurity injection after the formation of sidewall 12, as shown in FIG. 27, to form lightly doped regions 10 and 11. Then, a resist film 30 is formed to cover sidewall 12 and gate electrode 8 and then resist film 30 is used as a mask to implant an impurity to form heavily doped regions 14 and 15. This process allows an offset structure to be readily formed in a TFT with the superior characteristics described in the first embodiment.

Third Embodiment

While the first and second embodiments have each described a process for manufacturing a TFT of top gate type in which gate electrode 8 is positioned above polycrystalline silicon film 3, the third embodiment will describe a process for manufacturing a TFT of bottom gate type in which a gate electrode is positioned below a polycrystalline silicon film.

Figure 29:
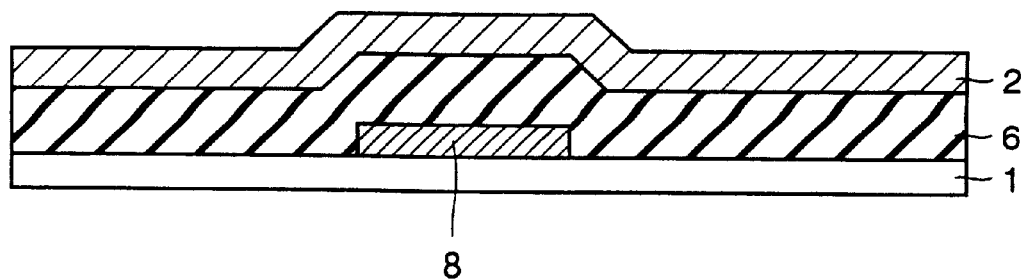
FIGS. 29–39 are cross sections illustrating a process for manufacturing a semiconductor device (a TFT) according to a third embodiment of the present invention.

As shown in FIG. 29, a gate electrode 8 is first formed on transparent insulating substrate 1. Interlayer insulating film 6 is formed to cover gate electrode 8. Amorphous silicon film 2 is deposited on interlayer insulating film 6 by the LPCVD method with disilane gas ($Si_2H_6$) used as a material gas in approximately 450° C. to have a film thickness of approximately 100 nm.

Figure 30:
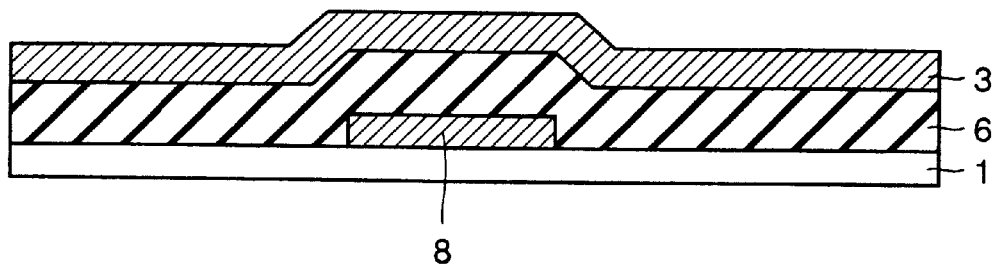

Then, amorphous silicon film 2 is annealed by solid phase crystallization in approximately 600° C. for approximately 20 hours, to be polycrystalline. Thus, polycrystalline silicon film 3 is formed having a film thickness of approximately 90 nm, as shown in FIG. 30.

Figure 31:
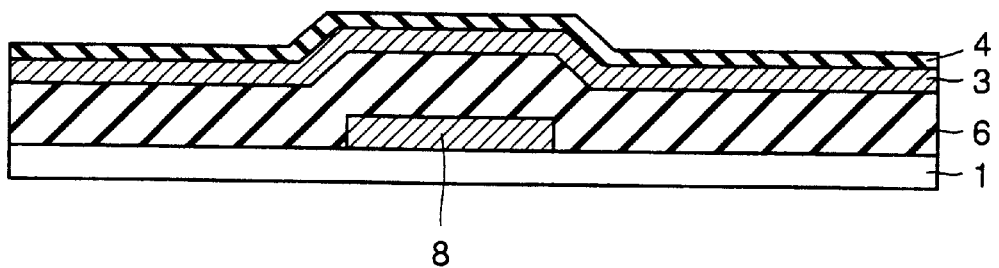

Then, as shown in FIG. 31, dry oxidation is applied to a surface of polycrystalline silicon film 3 in an $O_2$ ambient of approximately 1050° C. for approximately 30 minutes to form silicon dioxide film 4 of approximately 30 nm in film thickness. In this state, polycrystalline silicon film 3 has had a film thickness of approximately 50 nm to 60 nm.

Figure 32:
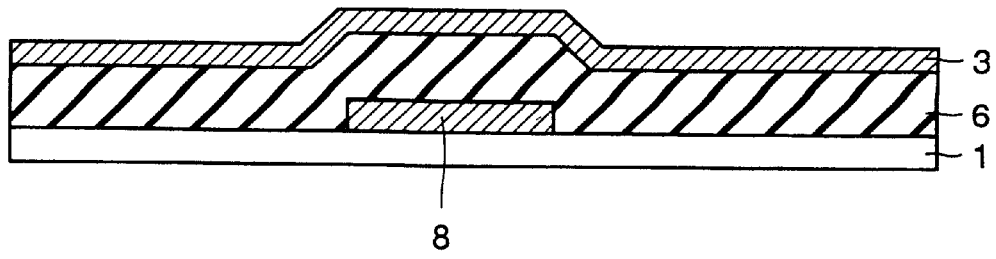

Then, a hydrofluoric acid based etchant is used to wet-etch and remove silicon dioxide film 4 to expose a surface of polycrystalline silicon film 3, as shown in FIG. 32. The oxidation of a surface of polycrystalline silicon film 3 to form silicon dioxide film 4 and the subsequent removal of silicon dioxide film 4 can improve the crystallinity of polycrystalline silicon film 3, which will serve as an active layer of a TFT.

Figure 33:
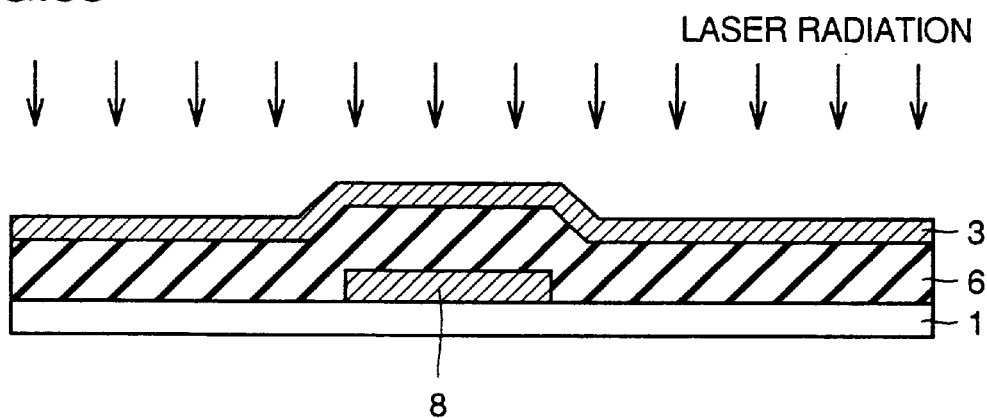

Then, as shown in FIG. 33, a surface of polycrystalline silicon film (active layer) 3 is irradiated with KrF excimer laser beam with a wavelength $\lambda$ of 248 nm for laser annealing. The conditions for the radiation are the same as those applied in the fifth step of the first embodiment shown in FIG. 5. Various types of high energy beam other than KrF excimer laser beam can also be used, as in the first embodiment.

Figure 34:
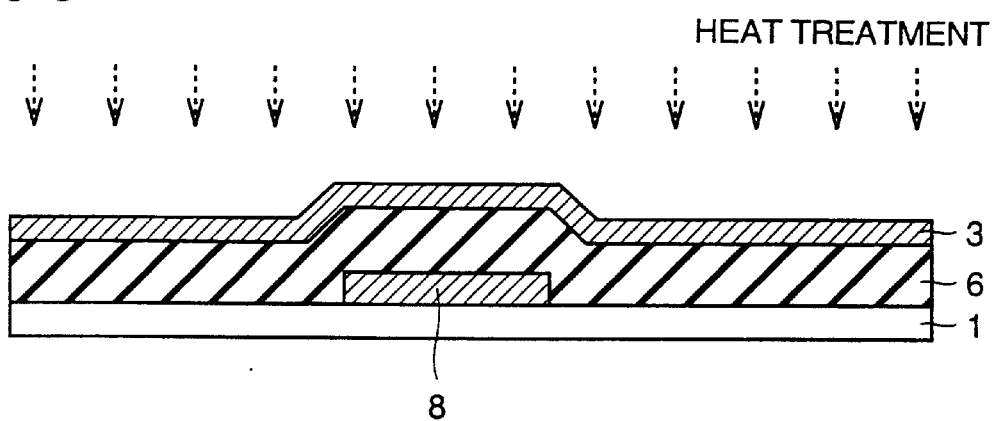

Then, a rapid heat treatment according to the RTA method is provided, as shown in FIG. 34. The heat treatment is provided at a temperature of approximately 900° C. to approximately 1100° C. in a $N_2$ ambient for one to ten seconds with Xe arc lamp used as a heat source. Although the heating according to the RTA method is provided at high temperature, it is finished in an extremely short period of time. Thus, disadvatanges can be prevented, such as transparent insulating substrate 1 deformed while crystal defect of polycrystalline silicon film 3 is reduced by the high-temperature heat treatment.

Figure 35:
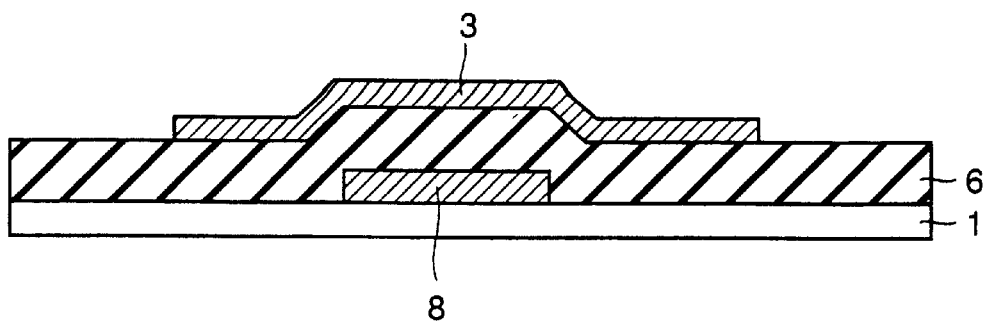

Then, polycrystalline silicon film 3 which has been subjected to the laser radiation and the heat treatment is patterned by photolithography and dry etching to obtain a polycrystalline silicon film 3 in the shape as shown in FIG. 35.

Figure 36:
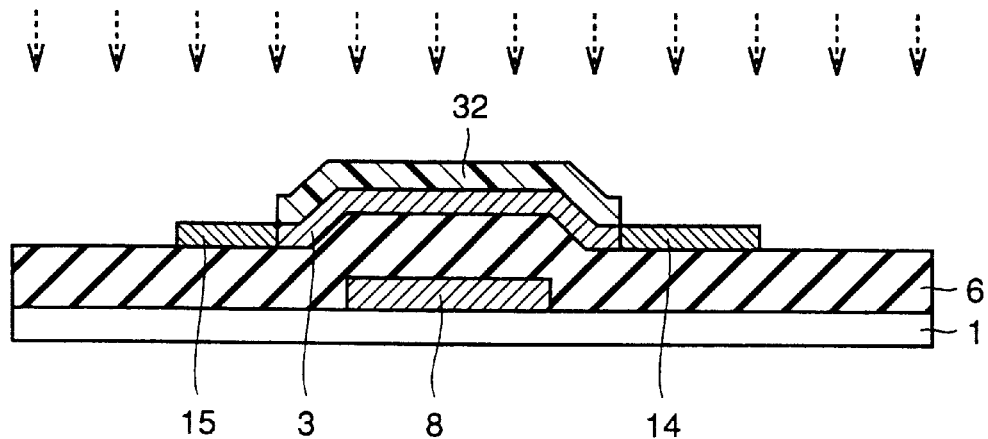

Then, as shown in FIG. 36, a resist film 32 is formed on a predetermined portion of polycrystalline silicon film 3. Resist film 32 is then used as a mask to ion-implant an impurity into polycrystalline silicon film 3 to form heavily doped regions 14 and 15. Resist 32 is then removed.

Figure 37:
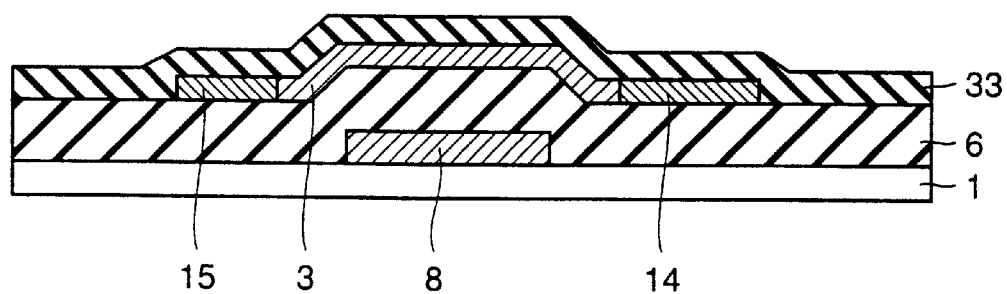
Figure 38:
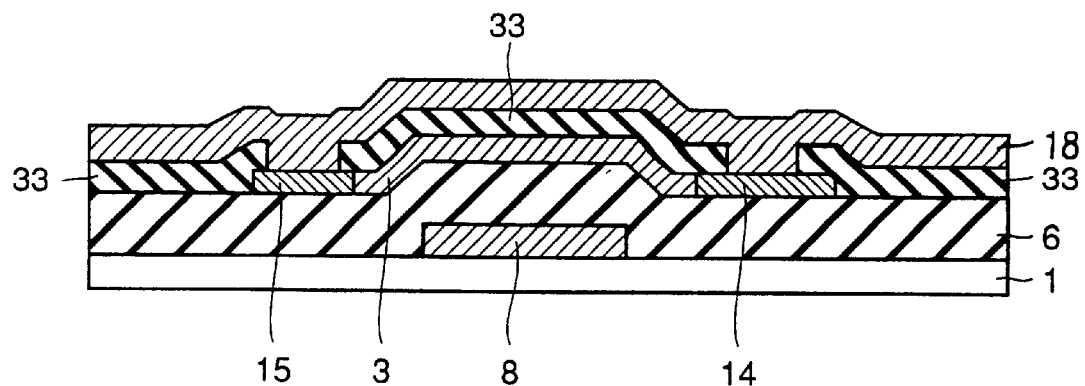
Figure 39:
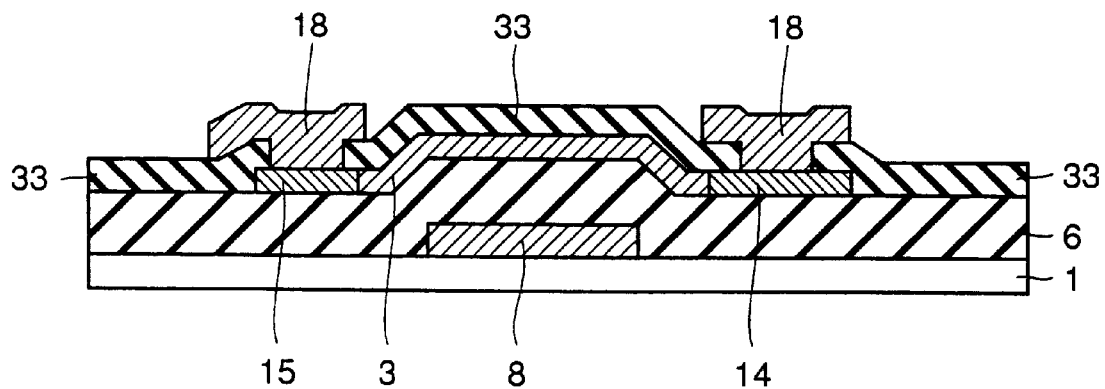

Then, as shown in FIG. 37, interlayer insulating film 33 is formed to cover polycrystalline silicon film 3 and interlayer insulating film 6. Then, as shown in FIG. 38, a contact hole is formed in a region of interlayer insulating film 33 that is positioned on each of heavily doped regions 14 and 15, and then an AlSi film, which will serve as source/drain electrode 18, is formed to fill the contact hole and extend on interlayer insulating film 33. The AlSi film is then patterned to form source/drain electrode 18 as shown in FIG. 39.

It should be noted that according to the third embodiment, polycrystalline silicon film 3 is subjected to laser radiation followed by heat treatment so that a multiplier effect of the improvement in crystallinity by the laser radiation and the improvement in surface roughness by the heat treatment can be obtained. Accordingly, the field-effect mobility of a TFT formed can be improved and the drain current of the TFT can thus be increased.

In the laser radiation step shown in FIG. 33, the laser radiation may be provided while transparent insulating substrate 1 is heated. This allows the surface roughness of polycrystalline silicon film 3 to be further reduced and thus the field-effect mobility (the drain current) of the TFT to be further increased.

Figure 40:
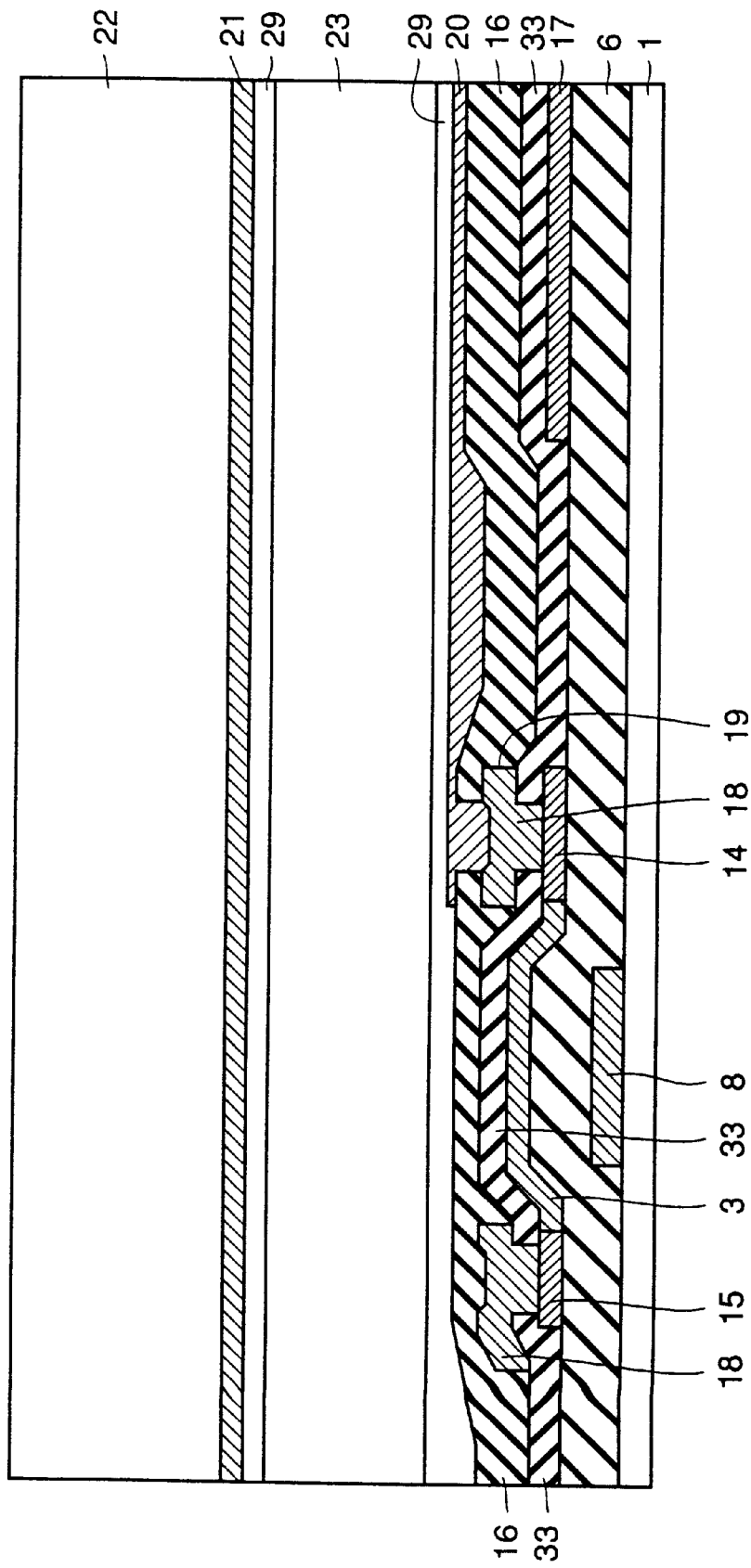
FIG. 40 is a cross section of an LCD with application of the TFT according to the third embodiment.

FIG. 40 is a cross section of an LCD including a TFT formed by the manufacturing process according to the third embodiment. The LCD shown in FIG. 40 differs from that shown in FIG. 24 only in that the LCD shown in FIG. 40 employs a TFT of bottom gate type. The use of a TFT with large field-effect mobility (i.e., large drain current) in an LCD allows rapid operation of the drive circuit portion as well as the high definition and high density of the pixel portion.

It should be noted that while amorphous semiconductor film 2 in the first to third embodiments is amorphous silicon film, it may be an amorphous semiconductor film of selenium (Se), germanium (Ge), gallium arsenide (GaAs) or gallium nitride (GaN).

While the high energy beam in the first to third embodiments is excimer laser, it may be xenon (Xe) arc lamp. It should be noted, however, that excimer laser is preferably used when amorphous silicon film is used as amorphous semiconductor film 2, since excimer laser is absorbed more.

While the technique of rendering amorphous semiconductor film 2 polycrystalline employed in the first to third embodiments is solid phase crystallization, it may be melting recrystallization method. Silicon dioxide film 4 formed on a surface of polycrystalline silicon film 3 may be formed by wet oxidation.

Fourth Embodiment

A process for manufacturing a TFT according to a fourth embodiment will now be described with reference to FIGS. 41–49. The manufacturing process according to the fourth embodiment provides laser radiation and heat treatment, as in the manufacturing processes according to the first to third embodiments. However, while the first to third embodiments employ solid phase crystalization, the fourth embodiment provides laser radiation to crystallize amorphous silicon film 2 into polycrystalline silicon film 3, which will be described below more specifically.

Figure 41:
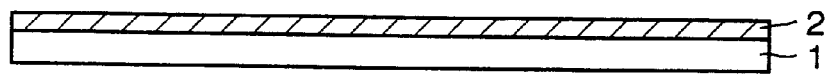
FIGS. 41–49 are cross sections illustrating a process for manufacturing a semiconductor device (a TFT) according to a fourth embodiment of the present invention.

FIG. 41 shows a first step in which amorphous silicon film 2 is formed on transparent insulating substrate 1 of glass or quartz glass by the LPCVD method with Si2H6 used as a material gas in 450° C. so that amorphous silicon film 2 has a film thickness of approximately 100 nm. Plasma chemical vapor deposition (P-CVD) may be employed to form amorphous silicon film 2 in approximately 300° C. so that amorphous silicon film 2 has a film thickness of approximately 100 nm.

Figure 42:
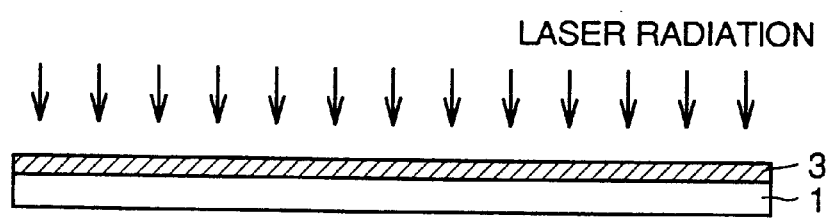

FIG. 42 shows a second step in which a surface of amorphous silicon film 2 is irradiated with excimer laser to provide laser annealing to change amorphous silicon film 2 to polycrystalline silicon film 3, which will serve as an active layer of a TFT.

Figure 43:
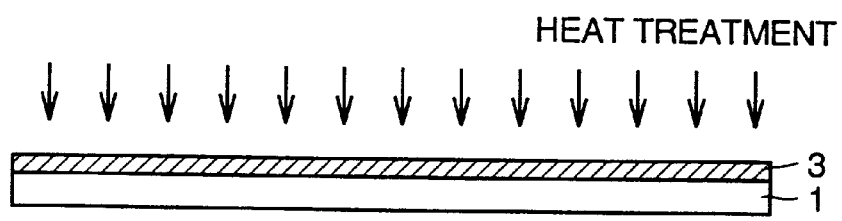

FIG. 43 shows a third step in which a rapid heat treatment is provided according to RTA method. The heat treatment is provided at a temperature of approximately 900° C. to approximately 1100° C. (preferably, approximately 950° C. to approximately 1100° C.) in a $N_2$ ambient for one to ten seconds with a Xe arc lamp used as a heat source. Although the heating according to the RTA method is provided at high temperature, it can be finished in an extremely short period of time. Accordingly, deformation of transparent insulating substrate 1 can be effectively prevented while crystal defect of polycrystalline silicon film 3 or the like is reduced by the high-temperature heat treatment. In place of the rapid heat treatment according to the RTA method, transparent insulating substrate 1 may be inserted into an electric furnace and subjected to a heat treatment in a $N_2$ ambient at approximately 1050° C. for two hours.

Figure 44:
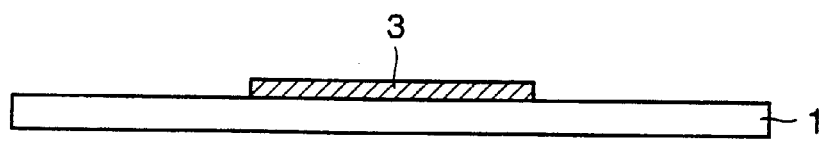

After the heat treatment described above, polycrystalline silicon film 3 is patterned by photolithography and dry etching to form a polycrystalline silicon film 3 patterned as shown in FIG. 44.

Figure 45:
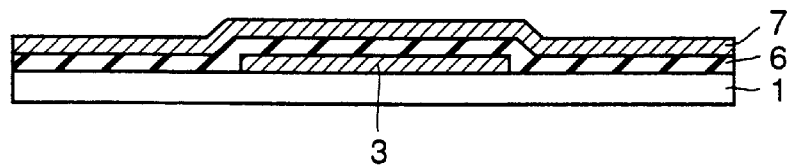

FIG. 45 shows a fifth step in which the LPCVD method is employed to form a low-temperature oxide (LTO) film or silicon oxide film as gate insulating film 6 to cover the patterned polycrystalline silicon film 3. The LPCVD method is employed at a substrate temperature of approximately no more than 500° C. The PCVD method may be employed at a substrate temperature of approximately no more than 500° C. to form a silicon oxide film which will serve as gate insulating film 6.

Polycrystalline silicon film 7 doped with phosphorus is then formed on gate insulating film 6 by the LPCVD method, although polycrystalline silicon film 7 is not necessarily doped with phosphorus.

Figure 46:
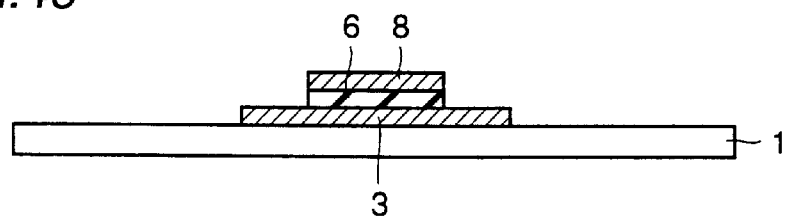

Then, photolithography and a dry etching technique according to the RIE method are used to pattern gate insulating film 6 and polycrystalline silicon film 7 to form gate insulating film 6 and gate electrode 8 of polycrystalline silicon film patterned as shown in FIG. 46.

Figure 47:
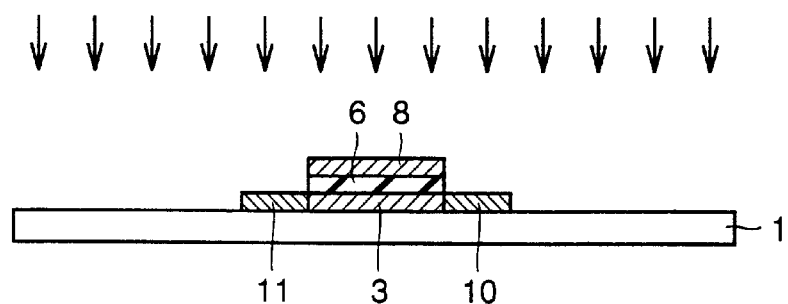

FIG. 47 shows a seventh step in which an impurity is implanted in an exposed portion of polycrystalline silicon film 3 and the upper surface of gate electrode 8. The implanted impurity is then activated by a heat treatment. The impurity is arsenic (As) or phosphorus (P) for n type and the conditions for the implantation are approximately 80 keV and approximately $3 \times 10^{13}$ cm$^2$. For a p-type impurity to be implanted, boron (B) is used and the conditions for the implantation thereof are approximately 30 keV and approximately $1.5 \times 10^{13}$ cm$^2$. Lightly doped regions 10 and 11 are thus formed as shown in FIG. 47.

Figure 48:
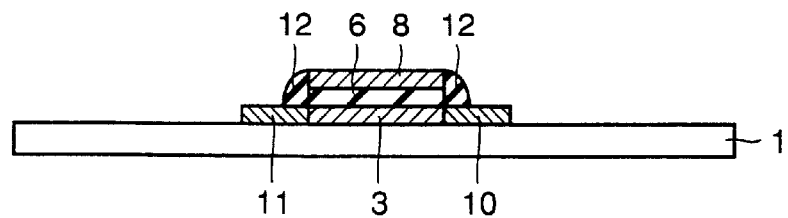

In an eighth step, an insulating film (not shown) is formed by atmospheric pressure CVD (APCVD) on transparent insulating substrate 1 to cover polycrystalline silicon film 3 and gate electrode 8. The insulating film is then anisotropically etched back at the entire surface to form sidewall 12 of the insulating film on a side surface of gate electrode 8 and gate insulating film 6, as shown in FIG. 48.

Figure 49:
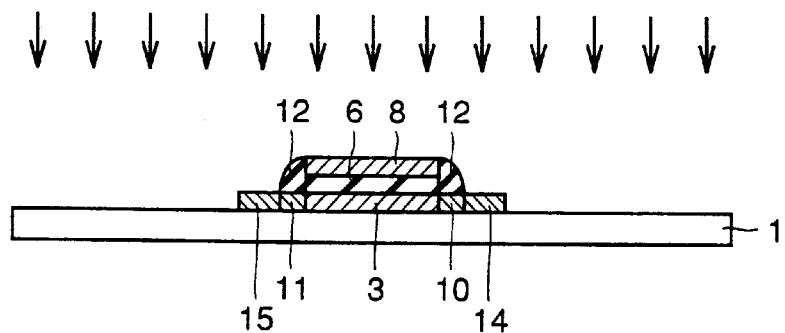

FIG. 49 shows a ninth step in which sidewall 12 is used as a mask to implant an impurity in polycrystalline silicon film 3 to form heavily doped regions 14 and 15 in self-alignment.

The impurity implanted in forming heavily doped regions 14 and 15 is phosphorus ions for n type. The conditions for the implantation are approximately 80 keV and approximately $3 \times 15$ cm$^2$. In this state, an electric furnace is also used to provide a heat treatment so that the impurity is activated. The heat treatment is provided at approximately 850° C. for approximately 30 minutes at a $N_2$ gas flow rate of approximately 5 l/min.

The heat treatment may be a rapid heat treatment according to the RTA method and is provided at a temperature of approximately 700° C. to approximately 950° C. in a $N_2$ ambient for one to three seconds with a Xe arc lamp used as a heat source. Although the heating according to the RTA method is provided at high temperature, it is finished in an extremely short period of time. Accordingly, deformation of transparent insulating substrate 1 can be prevented while crystal defect of polycrystalline silicon film 3 or the like is reduced by high-temperature heat treatment. Thus, a source/ drain region is formed having a LDD structure formed of lightly doped regions 10 and 11 and heavily doped regions 14 and 15.

A TFT with a polycrystalline silicon film as an active layer is thus formed by the above process.

The laser radiation in the second step shown in FIG. 42 is provided under similar conditions to the laser radiation in the fifth step of the first embodiment shown in FIG. 5, and can employ various types of high energy beam other than KrF excimer laser beam, as in the first embodiment. Furthermore, high throughput laser radiation is used, as in the first embodiment.

Whichever beam is used, the grain size of polycrystalline silicon film 3 is increased in proportion to radiation energy density and the frequency of the radiation. Accordingly, energy density and the frequency of the radiation are adjusted to obtain a desired grain size.

Fifth Embodiment

A process for manufacturing a TFT according to a fifth embodiment will now be described with reference to FIGS. 50–55. The manufacturing process according to the fifth embodiment is basically similar to that of the fourth embodiment. However, the fifth embodiment differs from the fourth embodiment in that the heat treatment after the laser radiation is provided after the formation of polycrystalline silicon film 7, the details of which will now be described below.

Figure 50:
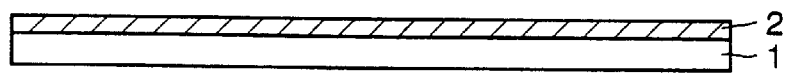
FIGS. 50–54 are cross sections illustrating a process for manufacturing a semiconductor device (a TFT) according to a fifth embodiment of the present invention.

In a first step, amorphous silicon film 2 is formed on transparent insulating substrate 1 of glass or quartz glass by the LPCVD method in approximately 450° C. with disilane gas ($Si_2H_6$) used as a material gas, as shown in FIG. 50. Amorphous silicon film 2 is formed to have a film thickness of approximately 100 nm.

Amorphous silicon film 2 may be formed by plasma chemical vapor deposition (P-CVD) in approximately 300° C. to have a film thickness of approximately 100 nm.

Figure 51:
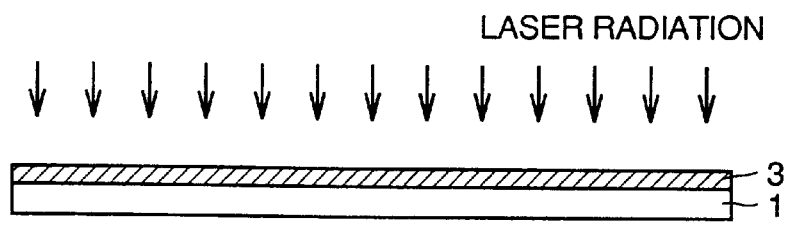

In a second step, a surface of amorphous silicon film 2 is irradiated with excimer laser for laser annealing to change amorphous silicon film 2 into polycrystalline silicon film 3 as shown in FIG. 51. Polycrystalline silicon film 3 will serve as an active layer of a TFT.

Figure 52:
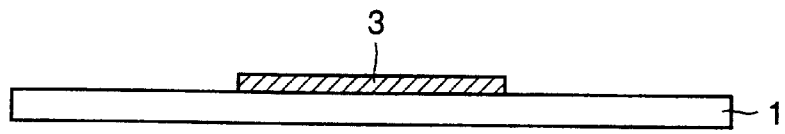

In a third step, polycrystalline silicon film 3 is patterned by photolithography and dry etching to form a polycrystalline silicon film 3 as shown in FIG. 52 at a TFT forming position.

Figure 53:
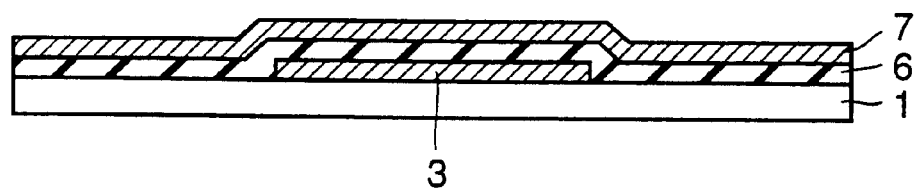

In a fourth step, a low-temperature oxide (LTO) film or silicon oxide film as gate insulating film 6 is formed on polycrystalline silicon film 3 by the LPCVD method at a substrate temperature of approximately no more than 500° C., as shown in FIG. 53. Gate insulating film 6 may be a silicon oxide film formed by the PCVD method (at a substrate temperature of approximately no more than 500° C.).

Then, polycrystalline silicon film 7 doped with phosphorus is formed on gate insulating film 6 by the LPCVD method, although polycrystalline silicon film 7 is not necessarily doped with phosphorus.

Figure 54:
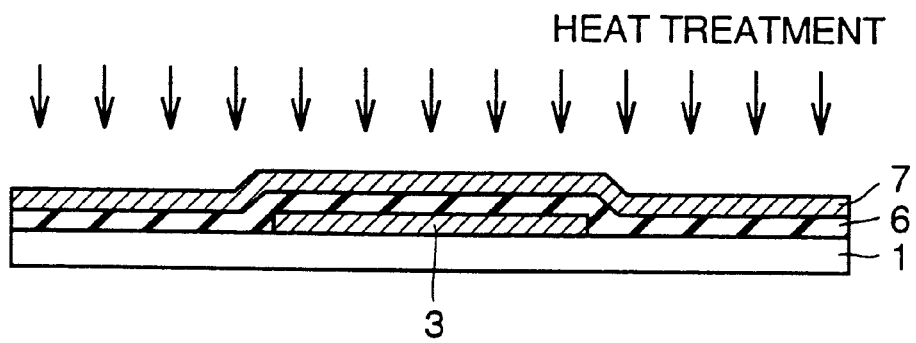

In a fifth step, a rapid heat treatment according to the RTA method is provided, as shown in FIG. 54. The heat treatment is provided at a temperature of approximately 900° C. to approximately 1100° C. (preferably, approximately 950° C. to approximately 1100° C.) in a $N_2$ ambient for one to ten seconds with a Xe arc lamp used as a heat source. Although the heating according to the RTA method is provided at high temperature, it is finished in an extremely short period of time. Accordingly, deformation of transparent insulating substrate 1 can be effectively prevented while crystal defect of polycrystalline silicon film 3 or the like is reduced by high-temperature heat treatment.

In place of the heat treatment according to the RTA method, an electric furnace may be used to provide a heat treatment in a $N_2$ ambient at approximately 1050° C. for approximately two hours.

Subsequent six to ninth steps are similar to those shown in FIGS. 46–49 according to the fourth embodiment and thus a description thereof is not repeated here.

According to the above process, a TFT can be formed having polycrystalline silicon film 3 as an active layer.

Figure 55:
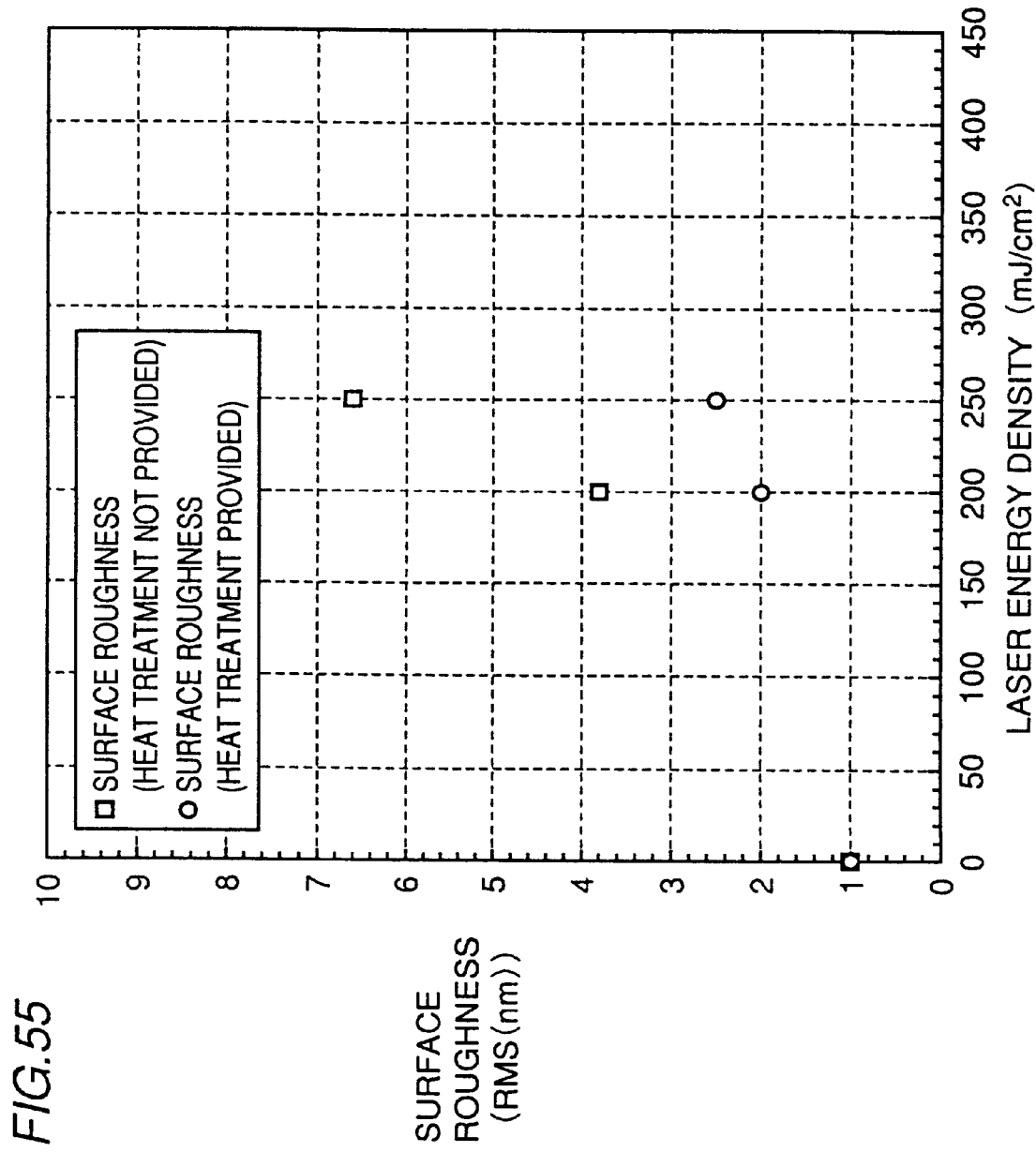
FIG. 55 is a diagram representing a characteristic of a semiconductor film of the present invention.

An effect of the heat treatment in the third step of the fourth embodiment and the heat treatment in the fifth step of the fifth embodiment will now be described. FIG. 55 is a graph representing roughnesses of a surface of polycrystalline silicon film with and without a heat treatment applied after polycrystalline silicon film 3 as an active layer is subjected to laser radiation. In FIG. 55, the horizontal axis represents laser radiation density and the vertical axis represents the roughness of a surface of polycrystalline silicon film 3. As shown in FIG. 55, the roughness of the surface is approximately 1.0 nm after amorphous silicon is subjected to laser radiation to be polycrystalline. With radiation density changed, the surface roughness in the example with a heat treatment peaks at approximately 2.5 nm, whereas the surface roughness in the example without a heat treatment is increased to approximately 6.7 nm.

Thus, the provision of a heat treatment after the laser radiation for polycrystalization of amorphous silicon layers 2 serving as an active layer can reduce the surface roughness of polycrystalline silicon film 3. Since the laser radiation improves crystallinity and the heat treatment after the laser radiation reduces the surface roughness of polycrystalline silicon film 3, the field-effect mobility of a TFT formed and hence the drain current of the TFT can be increased. Use of such a TFT in an LCD allows rapid operation of the drive circuit portion and the high definition and high density of the pixel portion.

Figure 56:
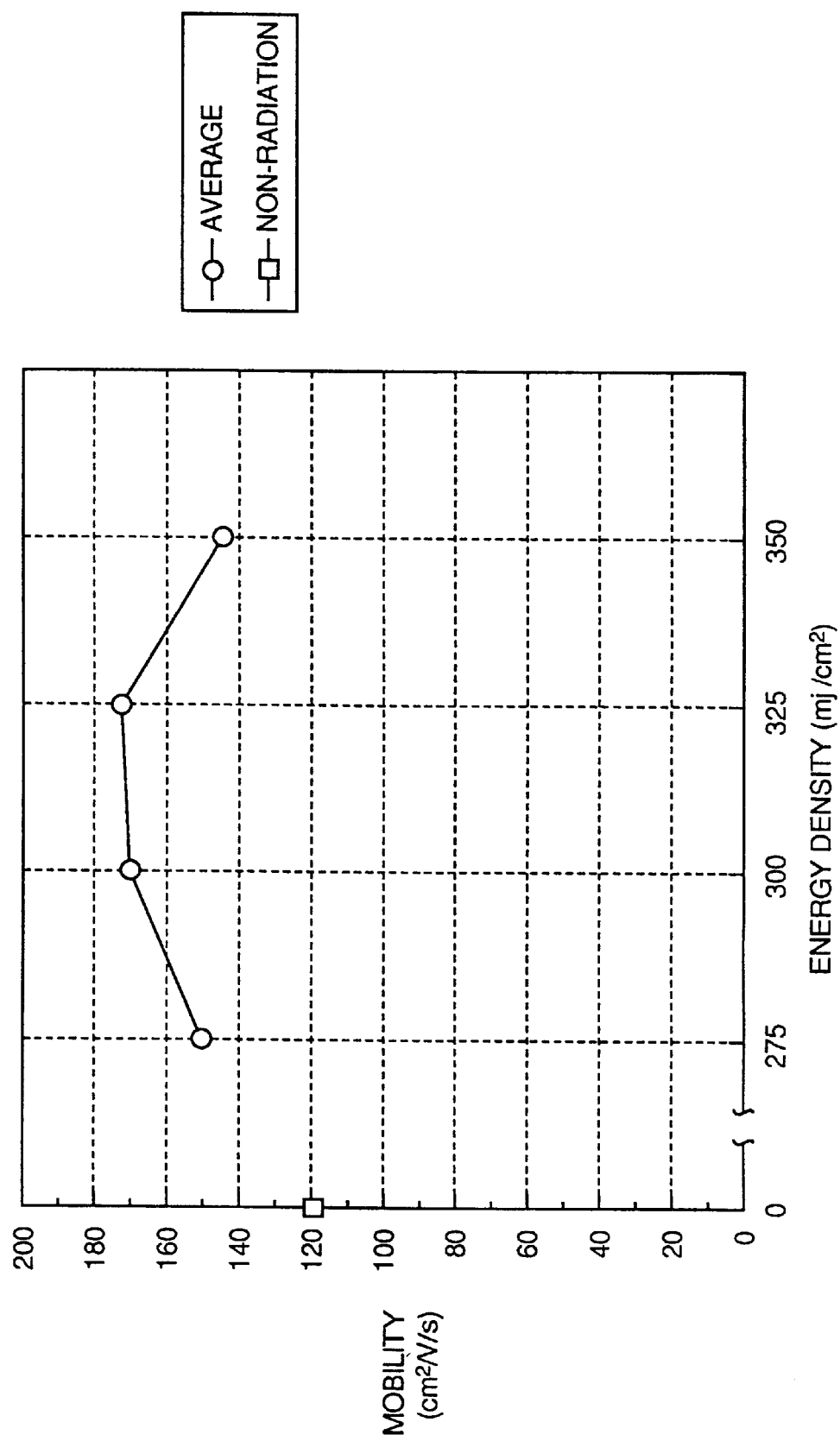
FIG. 56 is a diagram representing a characteristic of a semiconductor film of the present invention.

FIG. 56 represents a correlation between the field effect mobility of carrier in a polycrystalline silicon film and excimer laser radiation energy density after provision of the heat treatment following the laser radiation. In FIG. 56, as excimer laser radiation energy density is increased, field-effect mobility is also increased, peaks with an energy density of approximately 300 to 325 $mJ/cm^2$ and thereafter is gradually decreased. Such a peak is resulted from a traded-off relationship between the improvement in crystalinity by excimer laser radiation and surface roughness. The relationship between the improvement in crystallinity and surface roughness is best maintained around the peak and good field-effect mobility can thus be obtained.

It should be noted that the energy density at the peak shown in FIG. 56 (approximately 300 to 325 $mJ/cm^2$) is different from the energy density at the peak shown in FIG. 22 (approximately 250 $mJ/cm^2$), since both the heating during the laser radiation and the heating after the laser radiation are provided in FIG. 22, whereas only the heating after the laser radiation is provided in FIG. 56.

Sixth Embodiment

Figure 57:
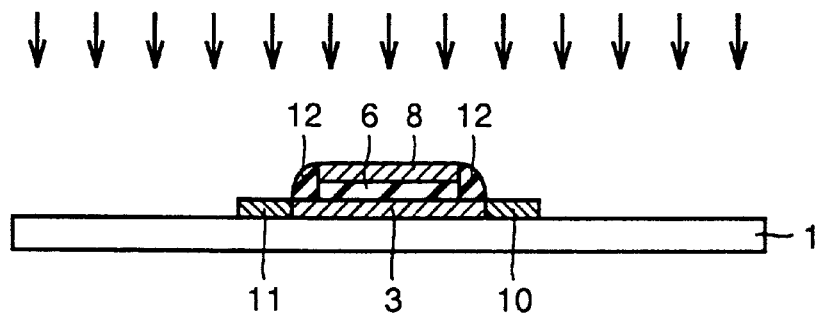
FIGS. 57 and 58 are cross sections illustrating a process for manufacturing a semiconductor device (a TFT) according to a sixth embodiment of the present invention.
Figure 58:
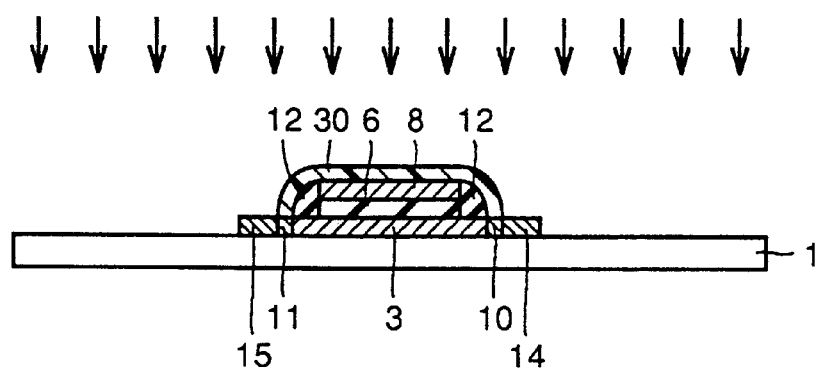

A process for manufacturing a TFT according to a sixth embodiment will now be described with reference to FIGS. 57 and 58. The sixth embodiment describes that an offset structure is formed in the seventh to ninth steps (shown in FIGS. 47–49) of the fourth and fifth embodiments. More specifically, as shown in FIG. 57, the impurity ion implantation for forming lightly doped regions 10 and 11 is provided after the formation of sidewall 12. Then, as shown in FIG. 58, resist film 30 is formed to cover sidewall 12 and gate electrode 8. Resist film 30 is then used as a mask to ion-implant an impurity into polycrystalline silicon film 3 to form heavily doped regions 14 and 15. A TFT of an offset structure can be readily formed by such a process. In the sixth embodiment also, laser radiation is provided in forming polycrystalline silicon film 3 and a heat treatment is then provided so that a TFT of high field-effect mobility can be formed, as in the fourth and fifth embodiments.

Seventh Embodiment

Figure 59:
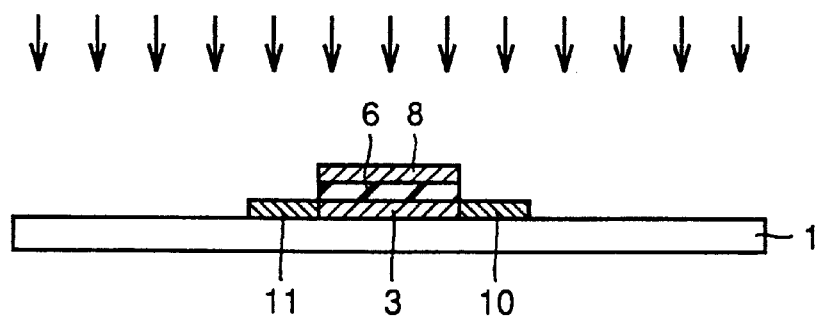
FIGS. 59–61 are cross sections illustrating a process for manufacturing a semiconductor device (a TFT) according to a seventh embodiment of the present invention.

A process for manufacturing a TFT according to a seventh embodiment will now be described with reference to FIGS. 59–61. The seventh embodiment describes that sidewall 12 is not provided in the manufacturing process according to the fourth embodiment shown in FIGS. 46–49.

According to the seventh embodiment, the structure shown in FIG. 46 is first formed by a manufacturing process similar to that according to the fourth embodiment shown in FIGS. 41–46. Then, as shown in FIG. 59, an impurity is implanted in an exposed portion of polycrystalline silicon film 3 and the upper surface of gate electrode 8. Then, a heat treatment is provided to activate the impurity. The impurity is arsenic (As) or phosphorus (P) for n-type impurity. The conditions for the implantation are approximately 80 keV and approximately $3\times10^{13}$ cm$^2$. Boron (B) is used for a p-type impurity. The conditions for the implantation thereof are approximately 30 keV and approximately $1.5\times10^{13}$ cm$^2$. Thus, lightly doped regions 10 and 11 are formed.

Figure 60:
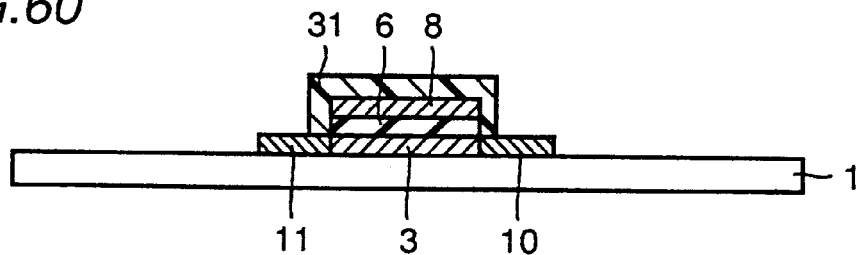

Then, resist 31 is formed as shown in FIG. 60 to cover gate electrode and a portion of lightly doped regions 10 and 11.

Figure 61:
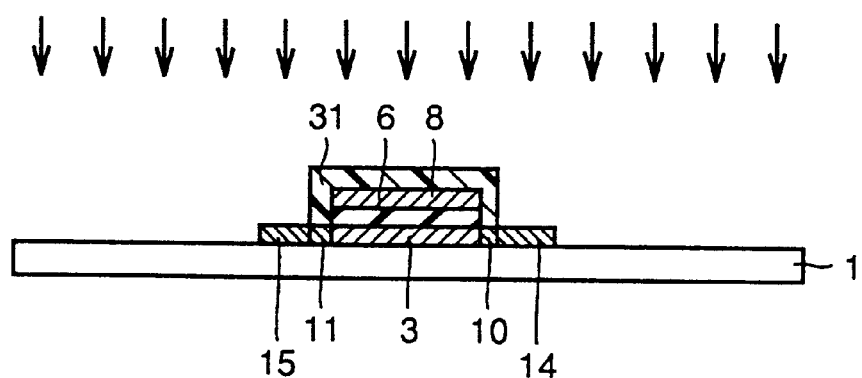

Then, as shown in FIG. 61, resist 31 is used as a mask to ion-implant an impurity into polycrystalline silicon film 3 to form heavily doped regions 14 and 15. Resist 31 is then removed. An impurity for forming heavily doped regions 14 and 15 is phosphorus ions for a n-type impurity and the conditions for the implantation are approximately 80 keV and approximately $3\times10^{15}$ cm$^2$. In this state, electric furnace is also used to provide a heat treatment to activate the impurity. The heat treatment is provided at approximately 850° C. for 30 minutes at a N$_2$ gas flow rate of approximately 5 l/min. Thus, a source/drain region is formed having a LDD structure formed of lightly doped regions 10 and 11 and heavily doped regions 14 and 15.

Eighth Embodiment

A process for manufacturing a TFT according to an eighth embodiment will now be described with reference to FIGS. 62–69. While the fourth to seventh embodiments have described processes for manufacturing TFTs of top gate type in which gate electrode 8 is positioned above polycrystalline silicon film 3, the eighth embodiment will describe a process for manufacturing a TFT of bottom gate type in which gate electrode 8 is positioned below polycrystalline silicon film 3. The basic manufacturing process with respect to laser radiation and heat treatment is almost similar to that of the fourth embodiment. The process will now be more specifically described below.

Figure 62:
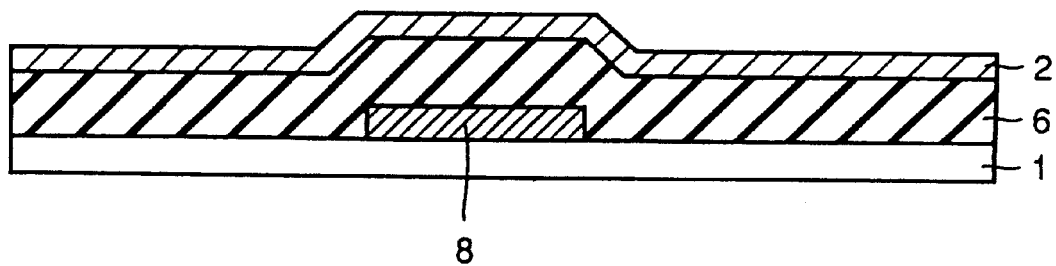
FIGS. 62–69 are cross sections illustrating a process for manufacturing a semiconductor device (a TFT) according of an eighth embodiment of the present invention.

First, as shown in FIG. 62, gate electrode 8 is formed on transparent insulating substrate 1 of glass or quartz glass and gate insulating film 6 is then formed to cover gate electrode 8. Amorphous silicon film 2 is formed on gate insulating film 6 by the LPCVD method or the P-CVD method so that amorphous silicon film 2 has a film thickness of approximately 100 nm.

Figure 63:
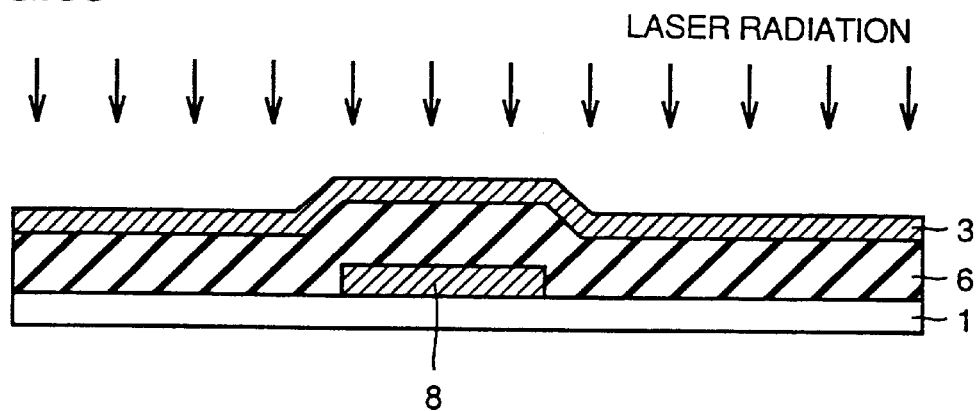

Then, a surface of amorphous silicon film 2 is irradiated with excimer laser for laser annealing to change amorphous silicon film 2 into polycrystalline silicon film 3 as shown in FIG. 63, which will serve as an active layer of a TFT.

Figure 64:
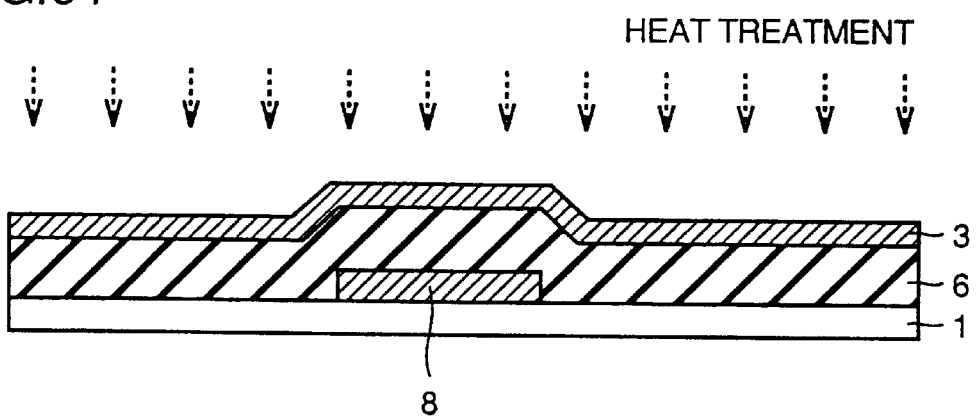
Figure 65:
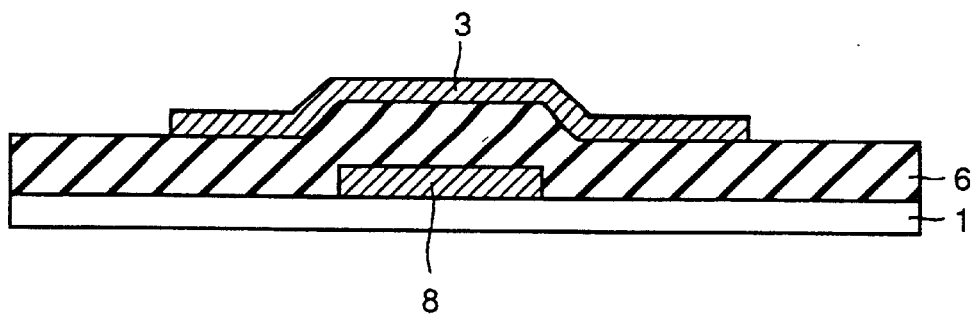

In a third step, a rapid heat treatment is provided according to the RTA method, as shown in FIG. 64. The heat treatment is provided at a temperature of approximately 900° C. to approximately 1110° C., preferably, approximately 950° C. to 1100° C., in a N$_2$ ambient for one to ten seconds with Xe arc lamp used as a heat source. Although the heating according to the RTA method is provided at high temperature, it is finished in an extremely short period of time. Accordingly, deformation of transparent insulating substrate 1 is prevented while crystal defect of polycrystalline silicon film 3 or the like is reduced by high-temperature heat treatment. In place of the heat treatment according to the RTA method, transparent insulating substrate 1 may be inserted into an electric furnace to provide a heat treatment in a N$_2$ ambient at approximately 1050° C. for approximately two hours. Then, polycrystalline silicon film 3 is patterned by photolithography and dry etching to form a polycrystalline silicon film 3 as shown in FIG. 65 at a TFT forming location.

Figure 66:
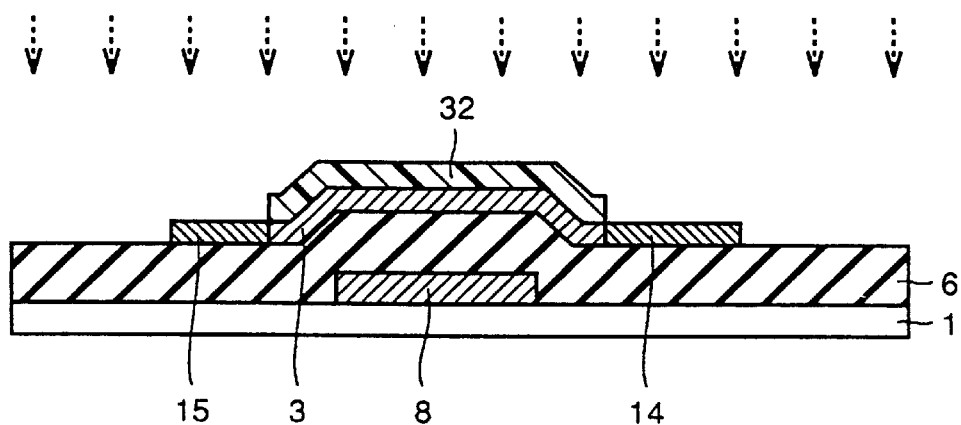

Then, as shown in FIG. 66, resist 32 is formed on polycrystalline silicon film 3 at a predetermined region and is then used as a mask to ion-implant an impurity into polycrystalline silicon film 3 to form heavily doped regions 14 and 15.

Figure 67:
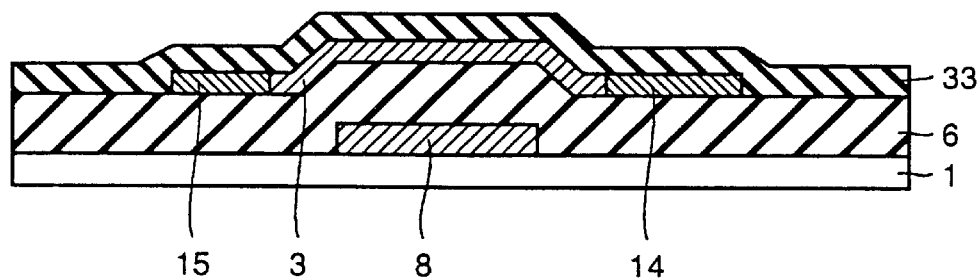
Figure 68:
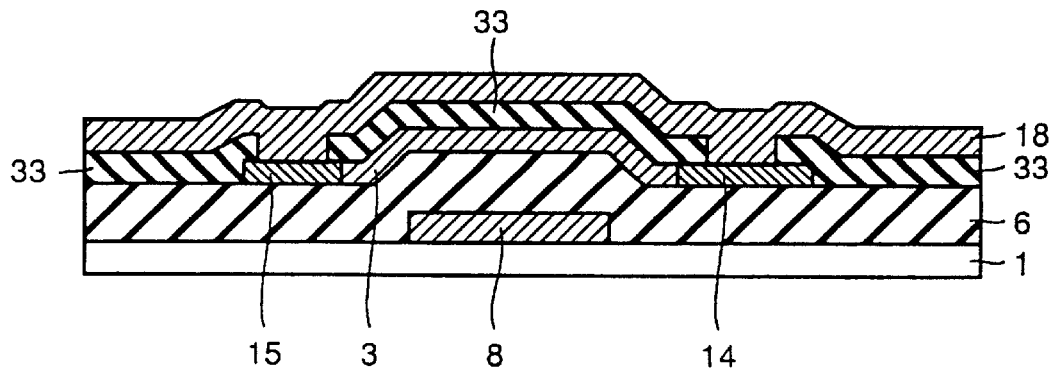
Figure 69:
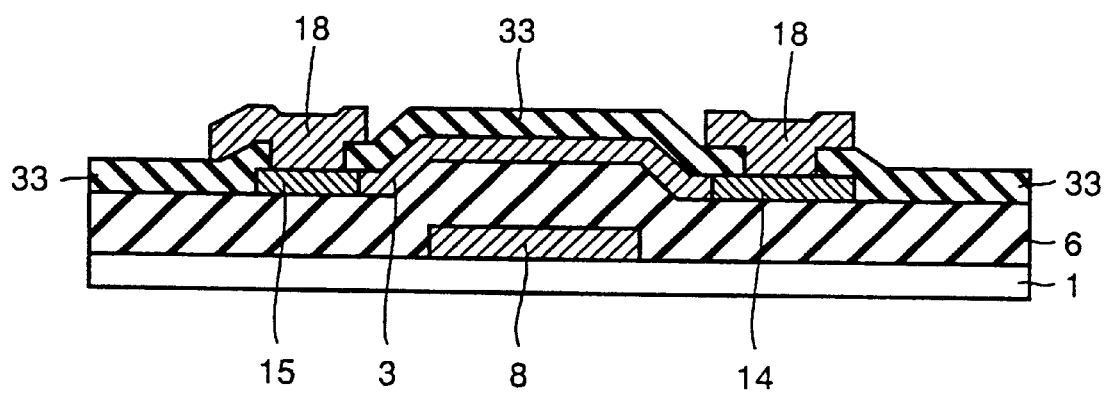

Then, as shown in FIG. 67, interlayer insulating film 33 is formed to cover polycrystalline silicon film 3 and gate insulating film 6. Then, a contact hole is opened, as shown in FIG. 68, at a region of interlayer insulating film 3 that is positioned on each of heavily doped regions 14 and 15. An AlSi film, which will serve as source/drain electrode 18, is formed to fill the contact hole and extend on interlayer insulating film 33. The AlSi film is then patterned to form source/drain electrode 18 as shown in FIG. 69. A TFT of bottom gate type can thus be formed. In the TFT of bottom gate type according to the eighth embodiment also, laser radiation improves the crystallinity of polycrystalline silicon film 3 and the heat treatment after the laser radiation reduces the surface roughness of the polycrystalline silicon film. Accordingly, the field-effect mobility of the TFT and hence the drain current of the TFT can be increased. It should be noted that application of such a TFT of bottom gate type to an LCD results in a structure similar to that shown in FIG. 40. Furthermore, such an application of the TFT according to the eighth embodiment to an LCD allows a faster drive circuit portion of the LCD and the high definition and high density of the pixel portion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A method of manufacturing a semiconductor device, comprising the steps of:
   forming a polycrystalline semiconductor layer on a substrate;
   radiating high energy beam toward said polycrystalline semiconductor layer; and
   then providing a heat treatment at a temperature of from 950 to 1100° C. under a temperature condition capable of reducing a roughness of a surface of said polycrystalline semiconductor layer, wherein a step of introducing impurities in the polycrystalline semiconductor layer has not been performed prior to the heat treatment.

2. The method of manufacturing a semiconductor device according to claim 1, wherein said heat treatment is provided by rapid thermal annealing.

3. The method of manufacturing a semiconductor device according to claim 1, wherein:

said step of forming said semiconductor layer includes forming a polycrystalline semiconductor layer by polycrystallization of an amorphous semiconductor layer by solid phase crystallization; and said step of radiating said high energy beam includes radiating said high energy beam toward said polycrystalline semiconductor layer.

4. The method of manufacturing a semiconductor device according to claim 3, wherein said high energy beam is radiated while said polycrystalline semiconductor layer is heated.

5. The method of manufacturing a semiconductor device according to claim 4, wherein said polycrystalline semiconductor layer is heated in a temperature of no less than 100° C.

6. The method of manufacturing a semiconductor device according to claim 3, wherein a surface of said polycrystalline semiconductor layer is oxidized to form an oxide film and said oxide film is removed to expose a surface of said polycrystalline semiconductor layer prior to the radiation of said high energy beam, and then said exposed polycrystalline semiconductor layer is irradiated with said high energy beam.

7. The method of manufacturing a semiconductor device according to claim 1, wherein:

said step of forming said semiconductor layer includes forming an amorphous semiconductor layer on said substrate; and said step of radiating said high energy beam includes forming a polycrystalline semiconductor layer by polycrystalization of said amorphous semiconductor layer through radiation of said high energy beam.

8. The method of manufacturing a semiconductor device according to claim 7, wherein said heat treatment is provided immediately after the radiation of said high energy beam.

9. The method of manufacturing a semiconductor device according to claim 7, wherein said heat treatment is provided after successive formation of an insulating film and a polycrystalline silicon film on said polycrystalline semiconductor layer following the radiation of said high energy beam.

10. The method of manufacturing a semiconductor device according to claim 7, wherein said heat treatment includes rapid thermal annealing.

11. The method of manufacturing a semiconductor device according to claim 1, wherein said high energy beam includes one of laser and xenon arc lamp.

12. The method of manufacturing a semiconductor device according to claim 1, wherein said semiconductor layer includes a silicon layer.

13. The method of manufacturing a semiconductor device according to claim 1, wherein said semiconductor layer includes an active layer of a thin film transistor.

14. The method of manufacturing a semiconductor device according to claim 1, wherein a gate electrode is formed on said semiconductor layer with a gate insulating film interposed therebetween after the formation of said semiconductor layer.

15. The method of manufacturing a semiconductor device according to claim 1, wherein said semiconductor layer is formed on a gate electrode formed on said substrate with a gate insulating film interposed therebetween.

16. The method of manufacturing a semiconductor device according to claim 1, comprising introducing impurities in the polycrystalline semiconductor layer only after providing the heat treatment.

17. A method of manufacturing a semiconductor device, comprising the steps of:

forming an amorphous semiconductor layer on an insulating substrate;

forming a polycrystalline semiconductor layer by polycrystallization of said amorphous semiconductor layer by solid phase crystallization;

radiating high energy beam toward said polycrystalline semiconductor layer; and then providing a heat treatment at a temperature of from 950 to 1100° C. under a temperature condition capable of reducing a surface roughness of said polycrystalline semiconductor layer, wherein a step of introducing impurities in the polycrystalline semiconductor layer has not been performed prior to the heat treatment.

18. The method of manufacturing a semiconductor device according to claim 17, wherein said high energy beam is radiated while said polycrystalline semiconductor layer is heated.

19. A method of manufacturing a semiconductor device, comprising the steps of:

forming an amorphous semiconductor layer on an insulating substrate;

forming a polycrystalline semiconductor layer by polycrystallization of said amorphous semiconductor layer by solid phase crystallization; and then providing a heat treatment at a temperature of from 950 to 1100° C. under a temperature condition capable of reducing a surface roughness of said polycrystalline semiconductor layer, wherein a step of introducing impurities in the polycrystalline semiconductor layer has not been performed prior to the heat treatment.

20. The method of manufacturing a semiconductor device according to claim 19, comprising introducing impurities in the polycrystalline semiconductor layer only after providing the heat treatment.

21. The method of manufacturing a semiconductor device according to claim 19, comprising introducing impurities in the polycrystalline semiconductor layer only after providing the heat treatment.

* * * * *